(12) United States Patent  (10) Patent No.: US 7,018,917 B2
Elers  (45) Date of Patent: Mar. 28, 2006

(54) MULTILAYER METALLIZATION

(75) Inventor: Kai-Erik Elers, Phoenix, AZ (US)

(73) Assignee: ASM International N.V., Bilthoven (NL)

( * ) Notice: Subject to any disclaimer, the term of this patent is extended or adjusted under 35 U.S.C. 154(b) by 27 days.

(21) Appl. No.: 10/719,277

(22) Filed: Nov. 20, 2003

(65) Prior Publication Data

US 2005/0110145 A1    May 26, 2005

(51) Int. Cl.
    *H01L 21/4763* (2006.01)
(52) U.S. Cl. .............. 438/622; 438/637; 438/638; 438/639; 438/668
(58) Field of Classification Search .......... 438/118, 438/119, 618, 619, 622, 637, 638, 639, 666, 438/667, 668, 675
    See application file for complete search history.

(56) References Cited

U.S. PATENT DOCUMENTS

| | | | |
|---|---|---|---|
| 4,450,472 A | 5/1984 | Tuckerman et al. | |
| 4,938,742 A | 7/1990 | Smits | |
| 5,218,515 A | 6/1993 | Bernhardt | |
| 5,241,450 A | 8/1993 | Bernhardt et al. | |
| 5,461,003 A | 10/1995 | Havemann et al. | |
| 5,619,177 A | 4/1997 | Johnson et al. | |
| 5,777,292 A | 7/1998 | Grigorov et al. | |
| 5,901,037 A | 5/1999 | Hamilton et al. | |
| 5,936,295 A | 8/1999 | Havemann et al. | |
| 6,060,383 A | 5/2000 | Nogami et al. | |
| 6,239,025 B1 * | 5/2001 | Bease et al. ............... | 438/637 |
| 6,272,169 B1 | 8/2001 | Boswell, Jr. et al. | |
| 6,291,353 B1 * | 9/2001 | Muller et al. ............. | 438/700 |
| 6,365,529 B1 * | 4/2002 | Hussein et al. ............ | 438/780 |
| 6,406,995 B1 * | 6/2002 | Hussein et al. ............ | 438/638 |
| 6,482,733 B1 | 11/2002 | Raaijmakers et al. | |
| 6,534,395 B1 | 3/2003 | Werkhoven et al. | |
| 6,569,754 B1 * | 5/2003 | Wong et al. .............. | 438/612 |
| 6,629,425 B1 | 10/2003 | Vaiyapuri et al. | |
| 6,686,271 B1 | 2/2004 | Raaijmakers et al. | |
| 6,699,783 B1 | 3/2004 | Raaijmakers et al. | |
| 6,703,708 B1 | 3/2004 | Werkhoven et al. | |
| 6,716,693 B1 * | 4/2004 | Chan et al. ............... | 438/238 |
| 6,727,169 B1 | 4/2004 | Raaijmakers et al. | |
| 2003/0032281 A1 | 2/2003 | Werkhoven et al. | |
| 2003/0143839 A1 | 7/2003 | Raaijmakers et al. | |

FOREIGN PATENT DOCUMENTS

| | | |
|---|---|---|
| WO | WO 98/03996 | 1/1998 |
| WO | WO 98/03997 | 1/1998 |
| WO | WO 98/04109 | 1/1998 |
| WO | WO 03/053895 A2 | 7/2003 |

OTHER PUBLICATIONS

Blackburn, J.M. et al., "Deposition of conformal copper and nickel films from supercritical carbon dioxide," Science 294(5540) (2001) pp. 141-145.

(Continued)

*Primary Examiner*—Kevin M. Picardat
(74) *Attorney, Agent, or Firm*—Knobbe, Martens, Olson & Bear, LLP

(57) ABSTRACT

Multiple metallization layers in a partially fabricated integrated circuit are formed in a single process step. As a place-holder for the later-deposited metallization layers, sacrificial material is deposited in the integrated circuit at desired locations at various fabrication levels over a substrate. The sacrificial material is then removed to form a contiguous open volume spanning multiple fabrication levels. A conductor is then deposited in the open volume to form multiple metallization layers in a single step.

38 Claims, 20 Drawing Sheets

OTHER PUBLICATIONS

Cabanas, A. et al., "Alcohol-Assisted Deposition of Copper Films from Supercritical Carbon Dioxide," J. Chemistry of Materials 15(15) (2003) pp. 2910-2916.

Dagani, Ron, "Dry Spinning f Carbon Nanotube Yarns".

Kondoh, E. et al., "Characteristics of copper deposition in a supercritical CO2 fluid," Microelectronic Engineering 64(1-4) (2002) pp. 495-499.

Lesiak, B. et al., "Characterization of Polyacetylene and Polyacetylene Doped with Palladium," Polish J. Chem., 74:847-865 (2000).

J.-Q. Lü et al., Advanced Metallization Conference 2000 (ULSI XVI), pp. 515-521.

Shirakawa, Hideki et al., "Synthesis of Electrically Conducting Organic Polymers: Halogen Derivatives of Polyacetylene, $(CH)_x$," J.C.S., Chem. Comm., 578-580 (1977).

Tay, Andrew A.O., "Analytical Study on A MEMS Micro-Cooling System for Cooling of Flip Chips," Conf. on Design, Characterization, and Packaging for MEMS and Microelectronics, Queensland, Australia, Oct. 99, SPIE vol. 3893, pp. 82-93.

* cited by examiner

MULTILAYER METALLIZATION

FIELD OF THE INVENTION

The present invention relates generally to semiconductor processing and, more particularly, to methods of forming conductive elements.

BACKGROUND OF THE INVENTION

Continuously shrinking device features are setting increasingly high requirements for deposition and lithography techniques and will likely continue to do so in the future. For example, the high aspect ratio vias and trenches formed in connection with these shrinking device features increasingly suffer from poor step coverage of thin films, which can weaken the reliability of the integrated circuits containing them.

In response, new methods are being explored to find improved ways of metallization for integrated circuits. Metallization with copper in dual damascene structures and new low-k materials are currently among the highest priority subjects studied in integrated circuit (IC) technology. The copper metallization studies are mainly focused on single and dual damascene structures, where deposited insulator layers are patterned, vias and/or trenches are etched, surfaces of the openings are coated with a diffusion barrier and then the openings are filled with copper metal. Various shortcomings of conventional deposition techniques, e.g., physical vapor deposition (PVD) and chemical vapor deposition (CVD), are among the reasons why the copper metallization studies are concentrated on these basic structures. When the aspect ratio of the openings is over 8:1, it is very difficult to solve the step coverage problems with conventional CVD techniques, let alone PVD techniques, which can fail completely when used to process high aspect ratio vias and trenches. Consequently, alternative structures such as coaxial interconnect structures have been proposed, for example, by T. Nogami et al. in U.S. Pat. No. 6,060,383, to solve some of these problems.

Cost reduction in IC production is another challenge as more complex products with increasing numbers of transistors and interconnects require more process steps and more sophisticated and more expensive equipment for processing. This escalation in complexity has created a need for new circuit structures that can be formed with fewer process steps. Furthermore, the process steps should preferably be simpler and cheaper than those common today.

In addition, one of the most sensitive places in multi-level metallization structures is at the interface between metallization layers. In cases of insufficient bonding between metal lines and plugs, void formation easily takes place in high current applications. In addition, interface resistance exists between metallization layers on different levels because the diffusion barrier commonly between these levels typically has a resistivity of about 200–400 μΩ-cm. Undesirably, that resistivity is two orders of magnitude higher than the resistivity of copper metal.

Thus, there is a need for an improved method for processing IC structures that addresses the problems relating to the escalating numbers of process steps and the interface between metallization layers, as described above.

SUMMARY OF THE INVENTION

In accordance with one preferred embodiment of the invention, a process is provided for forming a conductive element. The process comprises providing a semiconductor substrate and depositing a sacrificial material over the substrate. An insulating layer is formed over the sacrificial material and an opening is formed in the insulating layer to partially expose the sacrificial material. Next, the sacrificial material is selectively removed to form a buried open volume and a conductor is simultaneously depositing in the buried open volume and in the opening to form the conductive element.

In accordance with another preferred embodiment of the invention, a method of semiconductor processing is provided. The method comprises providing a partially fabricated integrated circuit having a top surface and a generally vertical opening leading to a buried open volume which extends laterally beneath the top surface. The method further comprises forming a conductive line under the top surface by substantially filling the open volume with a conductor.

In accordance with yet another preferred embodiment of the invention, another method of semiconductor processing is provided. The method comprises providing a semiconductor wafer having a sacrificial material. The sacrificial material extends horizontally underneath a top surface of the wafer. The sacrificial material is removed to form an opening, the opening spanning more than one fabrication level. Then at least one monolayer of a material is deposited within the opening.

In accordance with another preferred embodiment of the invention, an integrated circuit is provided. The integrated circuit comprises a generally horizontally extending buried conductive element with a generally vertically extending conductive plug overlying and also in contact with it. A generally horizontally extending conductive line then overlies and is in contact with the conductive plug. A first minimum dimension of the conductive element is smaller than a second minimum dimension of the conductive plug and the second minimum of the conductive plug is smaller than a third minimum dimension of the conductive line.

In accordance with yet another preferred embodiment of the invention, a semiconductor device is provided. The device comprises a plurality of vertically spaced insulating layers and at least two vertically spaced trenches provided in the insulating layers. A contact via is also provided in one of the insulating layers. The contact via is positioned between and forms a single continuous volume with the trenches. A continuous barrier layer having a substantially uniform composition lines the trenches and the contact via.

BRIEF DESCRIPTION OF THE DRAWINGS

The invention will be better understood from the detailed description of the preferred embodiments and from the appended drawings, which are meant to illustrate and not to limit the invention, and wherein.

DETAILED DESCRIPTION OF THE PREFERRED EMBODIMENTS

Figure 1:
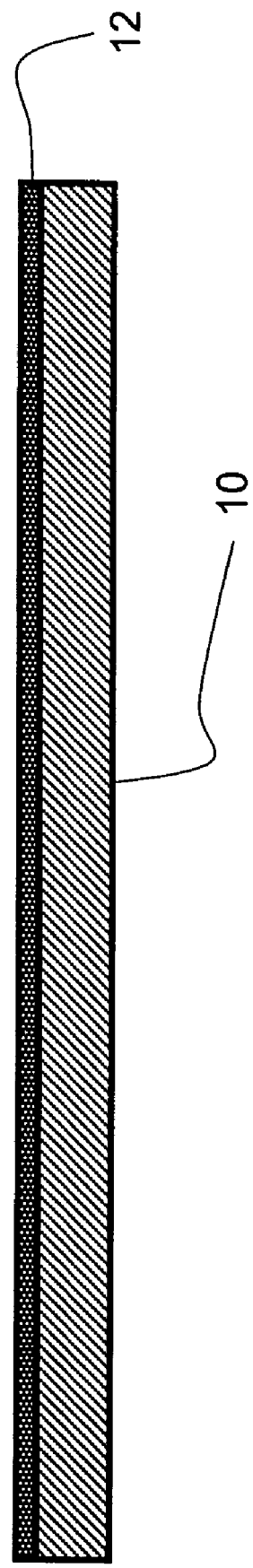
FIG. 1 is a schematic cross-sectional side view of a film structure on a substrate after depositing a dielectric copper diffusion barrier, in accordance with a prior art process.

Preferred embodiments of the invention address many of the problems discussed above by providing structures and methods in which one or more conductive elements can be formed after the formation of one or more overlying layers of material. As such, the conductive element and the space into which the conductive element is deposited are both buried features, i.e., both features are buried in the sense that an overlying material covers at least part of these features. Rather than depositing mutually contacting conductors in multiple stages, e.g., forming metallization layers and filling vias and trenches in different stages as different levels of these structures are formed, in the preferred embodiments the space for accommodating these conductors are preferably held open or temporarily filled with a sacrificial material. These spaces are then all opened. Subsequently, the openings are simultaneously filled with bulk conductor, before deposition of further overlying layers. Advantageously, by forming a continuous conductive path at one time, the number of conductor interfaces are minimized and problems with void formation and resistivity at conductor-to-conductor interfaces are also minimized.

In addition, at the same process stage and before deposition of the bulk metal, the openings can be coated with an optional diffusion barrier. Advantageously, the deposition of a diffusion barrier simultaneously for multiple levels reduces the total number of process steps needed to form a particular structure, since diffusion barriers need not be individually formed at every fabrication level containing a conductor. It will be appreciated that "fabrication level" is understood by the skilled artisan to refer to a particular vertical level over a substrate. For example, a fabrication level can be a device level (e.g., for transistors), a level containing a dual damascene structure comprising a trench and a via, a level containing only a trench or only a via in a conventional metallization process flow, etc. As such, it will be appreciated that the constitution of the fabrication level can vary depending upon the particular processing context, as known in the art.

While the buried conductive element can be formed at intermediate stages of forming a multi-level structure, e.g., every two or three fabrication levels for electrically connected conductive elements that exist on, e.g., four or six or more levels, the deposition of a conductor to form a conductive element can also advantageously be delayed until after the construction of the upper-most fabrication level that will contain a conductor in direct contact with a conductive element on a lower fabrication level. In the illustrated preferred embodiments, the upper-most fabrication level contains the last metallization layer, i.e., the uppermost metallization layer. In this application, it will be appreciated that the conductive element can be, e.g., a conductive line interconnecting electronic devices in an integrated circuit or a conductive plug, which preferably occupies single and/or dual damascene structures.

As noted above, place-holders for these conductive lines and plugs can be made in one or more fabrication levels by at least partly filling the structures containing these features with sacrificial material. Thus, in some preferred embodiments, the openings or template for the later-formed metallizations can be temporarily kept empty by covering the openings with a resist layer or, more preferably, the openings are filled with sacrificial material that is later selectively and easily etched off or evaporated away below about 400° C. Preferably, at least two metallization levels are made so that an interconnected, multi-level volume, temporarily filled with sacrificial material, is reserved for forming metal lines in trenches and plugs in vias. In addition, it is preferred to use design rules where the dimensions of single/dual damascene structures are increasing from the bottom to the top, so that the conductive elements can fill the metallization openings from bottom to top without cutting off the flow of reactants to lower openings. For example, the cross-sectional areas of plugs (orthogonal to the direction of current flow) increases with increasing height, while the cross-sectional area of lines (orthogonal to the direction of current flow) also increases with increasing height or fabrication level. Viewed another way, preferably, the minimum dimension of a lower structure, such as a metal line, is smaller than the minimum dimension of another structure, such as a plug, directly overlying the metal line, and the minimum dimension of the plug is smaller than the minimum dimension of another structure, such an another metal line, directly overlying the plug, and the minimum dimension of this other metal line is smaller than the minimum dimension of another structure, such an another plug, directly overlying this metal line, and so on.

After completing the construction of the multi-level metallization template and removing the sacrificial material, the final metallization of the whole structure substantially fills the openings with a conductive material that electrically interconnects electrical devices in contact with the openings; that is, the openings are filled with sufficient conductive material to form desired electrical connections with and between the electrical devices. Preferably, the final metallization is performed by ALD. The metallization step preferably includes contact cleaning, diffusion barrier deposition, optional seed layer deposition and bulk metal deposition.

In addition, as discussed in greater detail below, it will be appreciated that the present invention is not limited to a particular type of conductor or to a particular deposition method. For example, according to one embodiment the conductors are formed by injection molding of a conductive polymer or in situ polymerization of a conductive plastic including, e.g., iodine doped polyacetylene, polyaniline, polypyrrole or polythiophenes. In such a case, an oxygen diffusion barrier is preferably deposited to protect the electrically conductive polymers. The bulk conductor is preferably deposited by ALD or chemical fluid deposition (CFD). Consequently, it will be appreciated that while the preferred embodiments have principally been discussed with reference to the deposition of metals, metallization as used herein refers to the deposition of any conductor suitable for use in integrated circuits.

In other embodiments, the conductors can be formed from carbon nanotube slurry and relatively short nanotube bits are joined together with a weak electric field to form continuous conductors that stand extremely high current densities. In still another exemplary embodiment, the openings are filled with nanometal powder preferably suspended in supercritical fluid. The nano powder has fractal like size distribution and is heated to a moderate temperature to start the sintering process. The decreasing surface area of the nano powder releases thermal energy and the metal powder turns into a continuous solid conductor. In another exemplary embodiment, the openings are filled with a conductor comprising polaron threads.

Reference will now be made to the Figures, wherein like numerals refer to like parts throughout. It will be appreciated that these figures and the various parts of the figures are not necessarily drawn to scale.

While the preferred embodiments can be applied to deposit conductors in a structure having only a single buried metallization layer, the preferred embodiments are particularly beneficial when at least two metallization layers, especially including layers formed in dual damascene structures, are formed. Several ways of forming dual damascene and structures spanning multiple metallization levels, i.e., the fabrication levels containing metallization layers such as vias or metal lines, are known in the art. For example, buried hard masks can be used to define vias or successive soft masks can be used to form both trenches and vias. FIGS. 1–17 illustrate an exemplary method devised by IBM and utilizing double hard masks. While specific materials are described hereinbelow, the skilled artisan will readily appreciate that other materials can be substituted as long as they serve the functionality intended and suitable selective etch chemistries are available to arrive at the desired structures.

Figure 2:
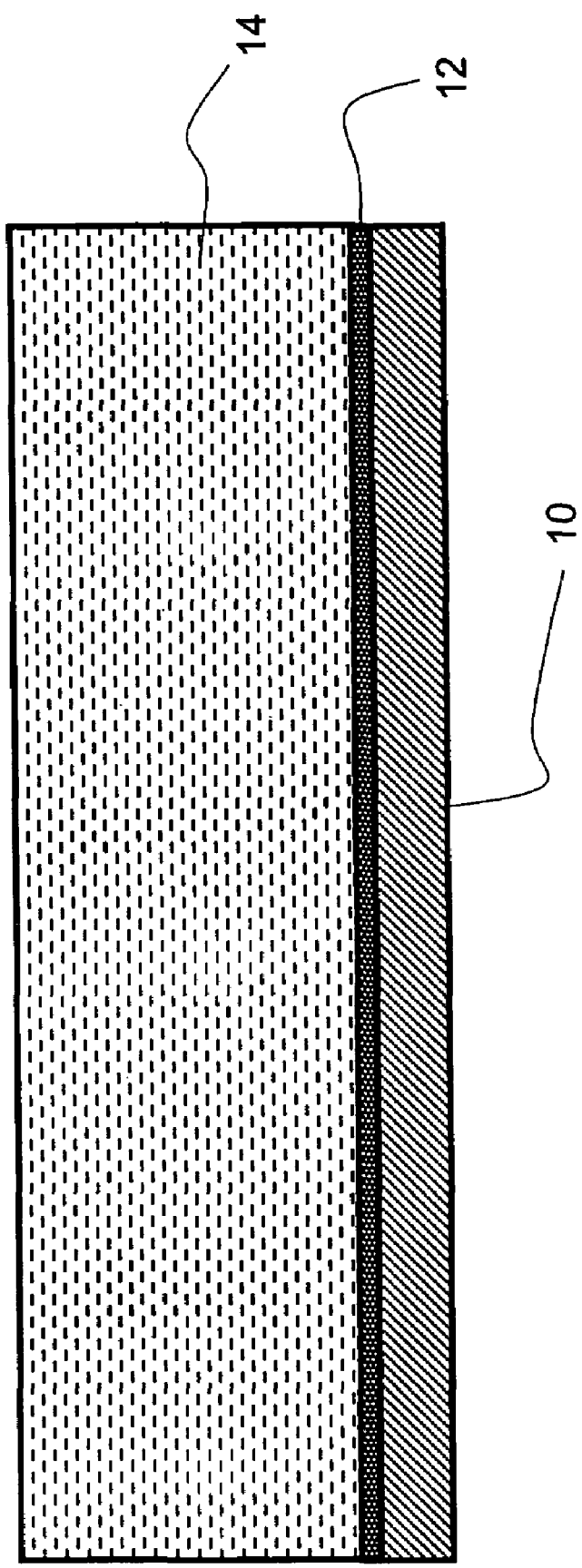
FIG. 2 is a schematic side view of the film structure of FIG. 1 after depositing an insulator, in accordance with a prior art process.
Figure 3:
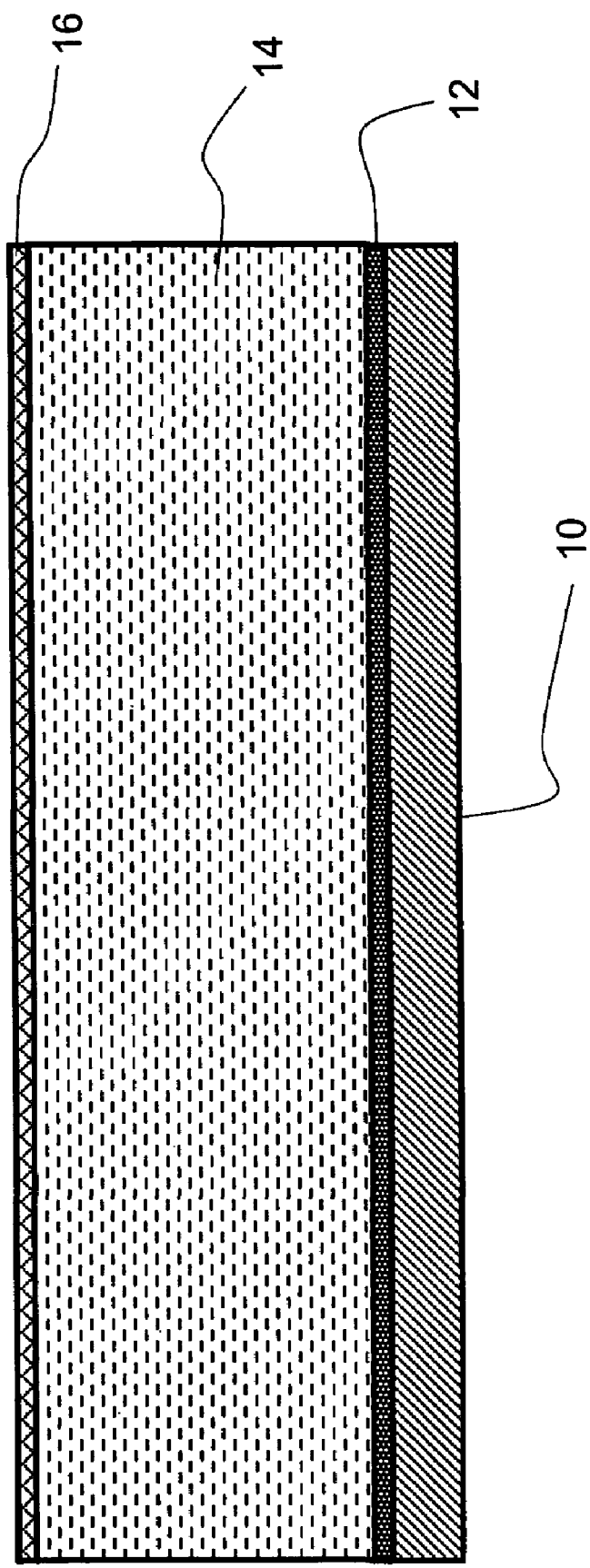
FIG. 3 is a schematic side view of the film structure of FIG. 2 after depositing a first hard mask layer, in accordance with a prior art process.

Initially, a dielectric barrier 12 against copper diffusion is deposited by CVD on a previous metallization layer 10 over a substrate. The resultant structure is shown in FIG. 1. As shown in FIG. 2, a spin-on dielectric (SOD) layer 14 or other interlevel dielectric (ILD) is then placed on the barrier 12. To form the layer 14, a dielectric solution containing a solvent is spread on the barrier 12 by spinning the substrate. Then the solvent is evaporated from the dielectric solution on the top surface of the barrier layer 12 and the dielectric layer 14 is cured on a hot plate. As shown in FIG. 3, an oxide hard mask 16 is then deposited by CVD on the dielectric layer 14. The oxide hard mask 16 serves as the first etch stop layer.

Figure 4:
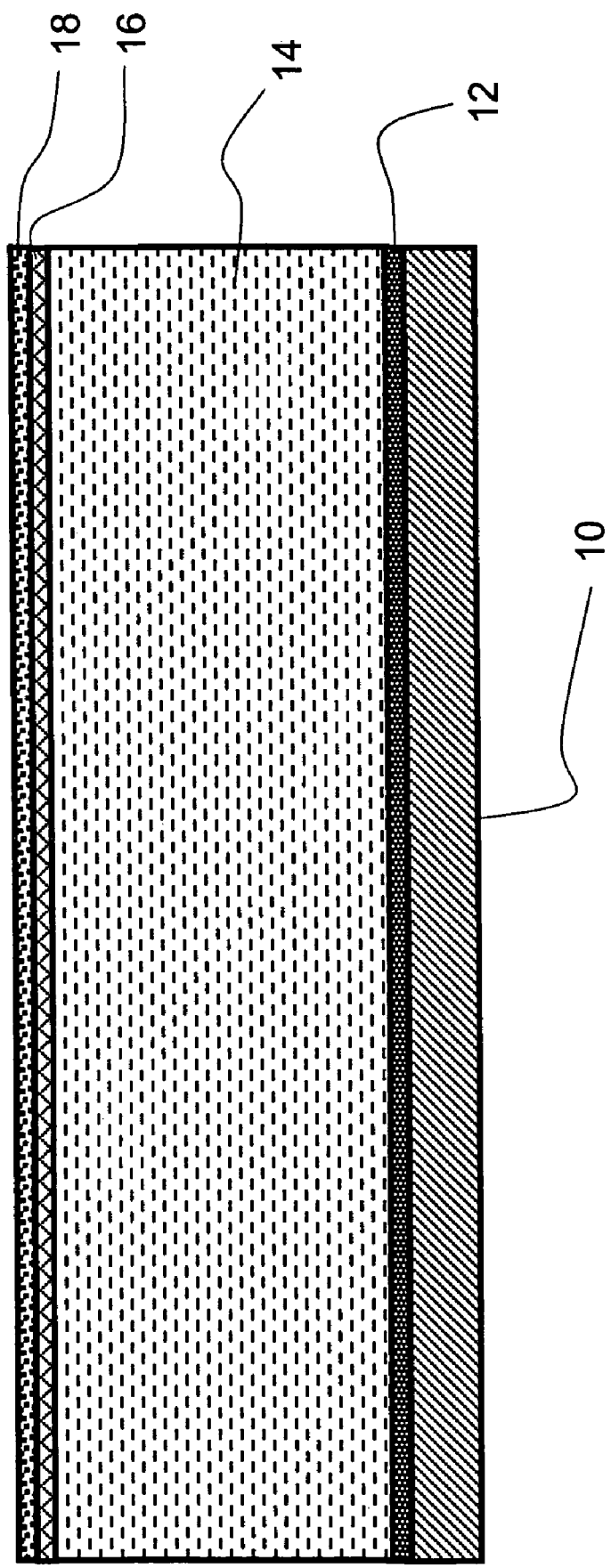
FIG. 4 is a schematic side view of the film structure of FIG. 3 after depositing a second hard mask layer, in accordance with a prior art process.
Figure 5:
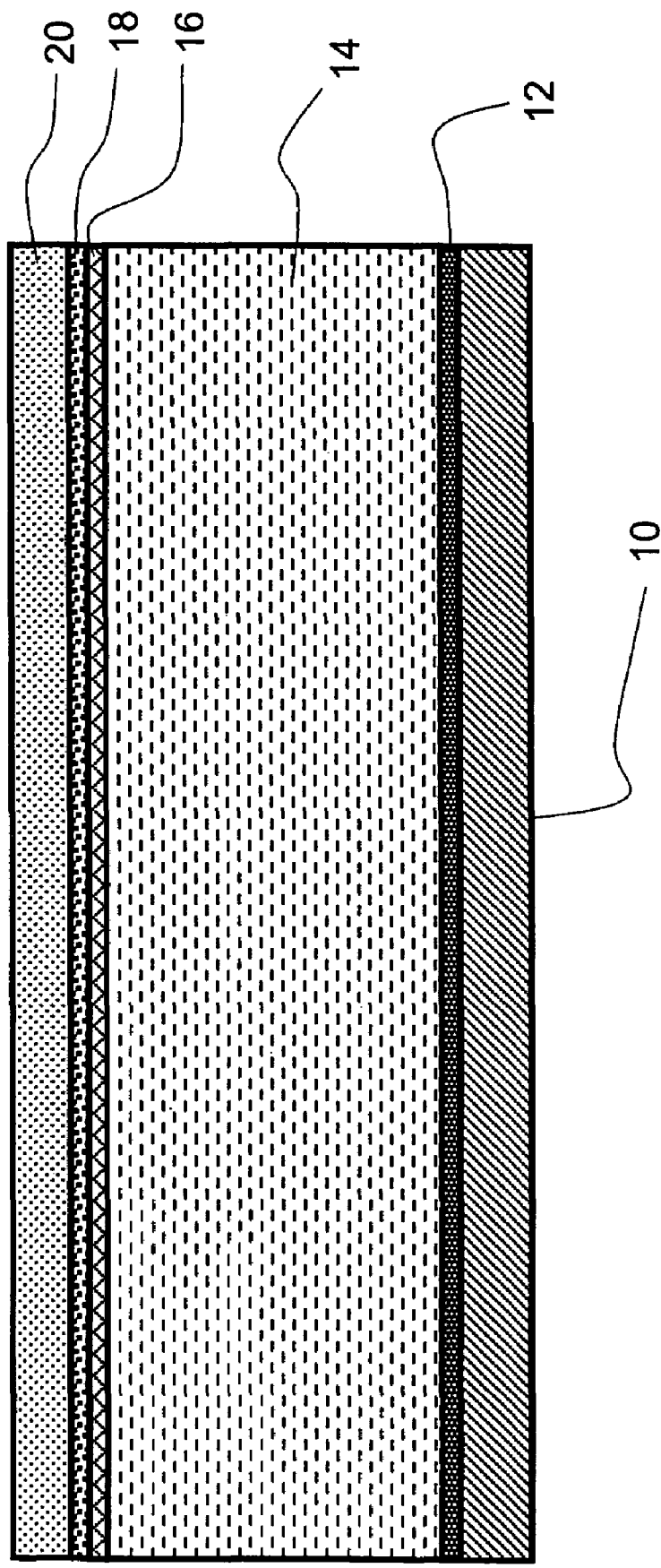
FIG. 5 is a schematic side view of the film structure of FIG. 4 after depositing a trench resist layer, in accordance with a prior art process.
Figure 6:
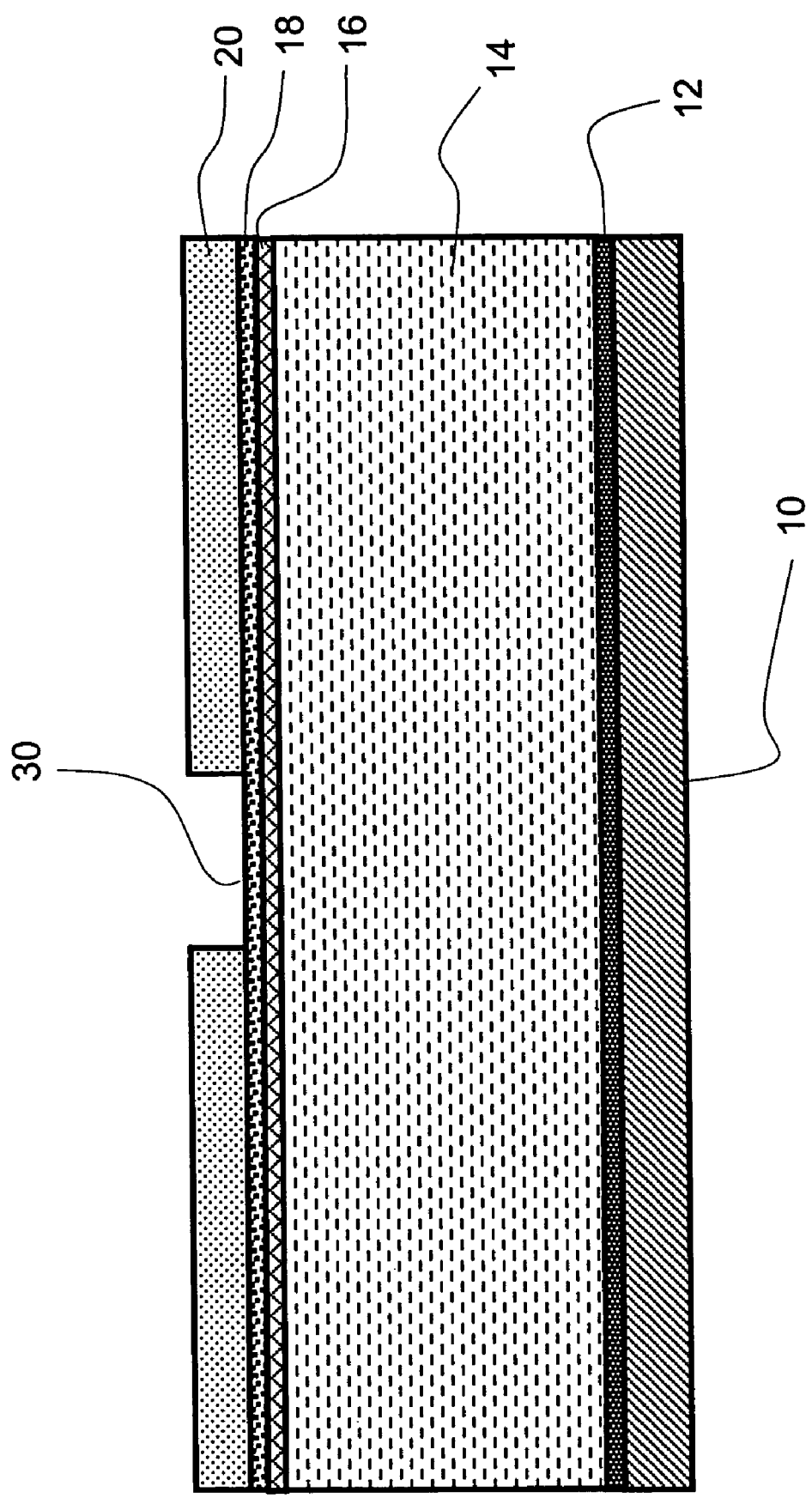
FIG. 6 is a schematic side view of the film structure of FIG. 5 after patterning the trench resist layer, in accordance with a prior art process.
Figure 7:
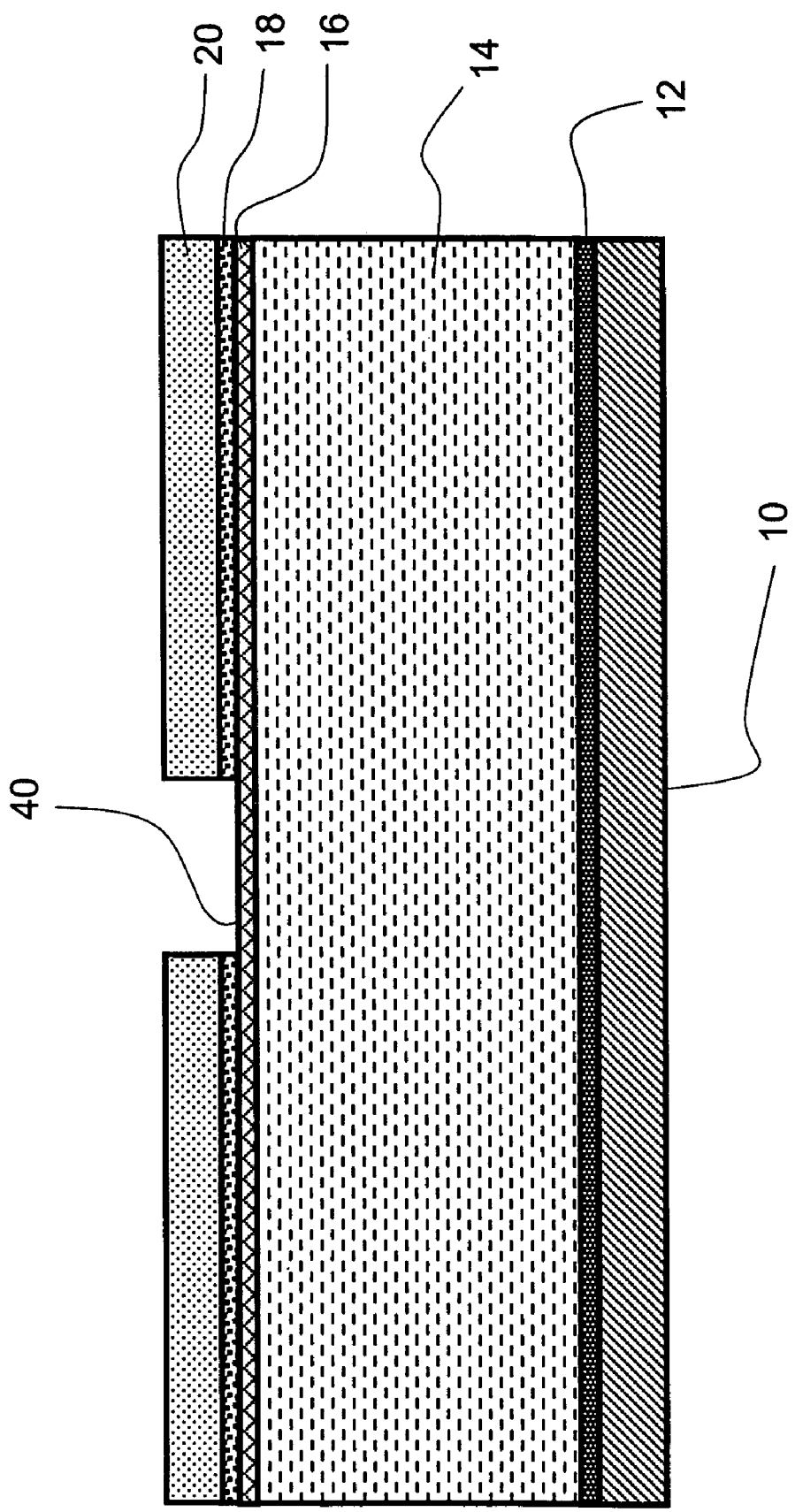
FIG. 7 is a schematic side view of the film structure of FIG. 6 after etching a part of the second hard mask layer from the trench areas, in accordance with a prior art process.

As shown in FIG. 4, a silicon carbide (SiC) hard mask 18 is grown by CVD on the oxide hard mask 16. The SiC hard mask 18 serves as the second etch stop layer. As shown in FIG. 5, a first photoresist 20 is then spread on the SiC hard mask 18. As shown in FIG. 6, the first photoresist is then patterned by being exposed to ultraviolet light through a reticle and dissolving the first photoresist away from the trench areas 30. Next, as shown in FIG. 7, the SiC hard mask 18 is etched away from the trench areas 40. The first photoresist 20 protects the rest of the SiC hard mask against etching.

Figure 8:
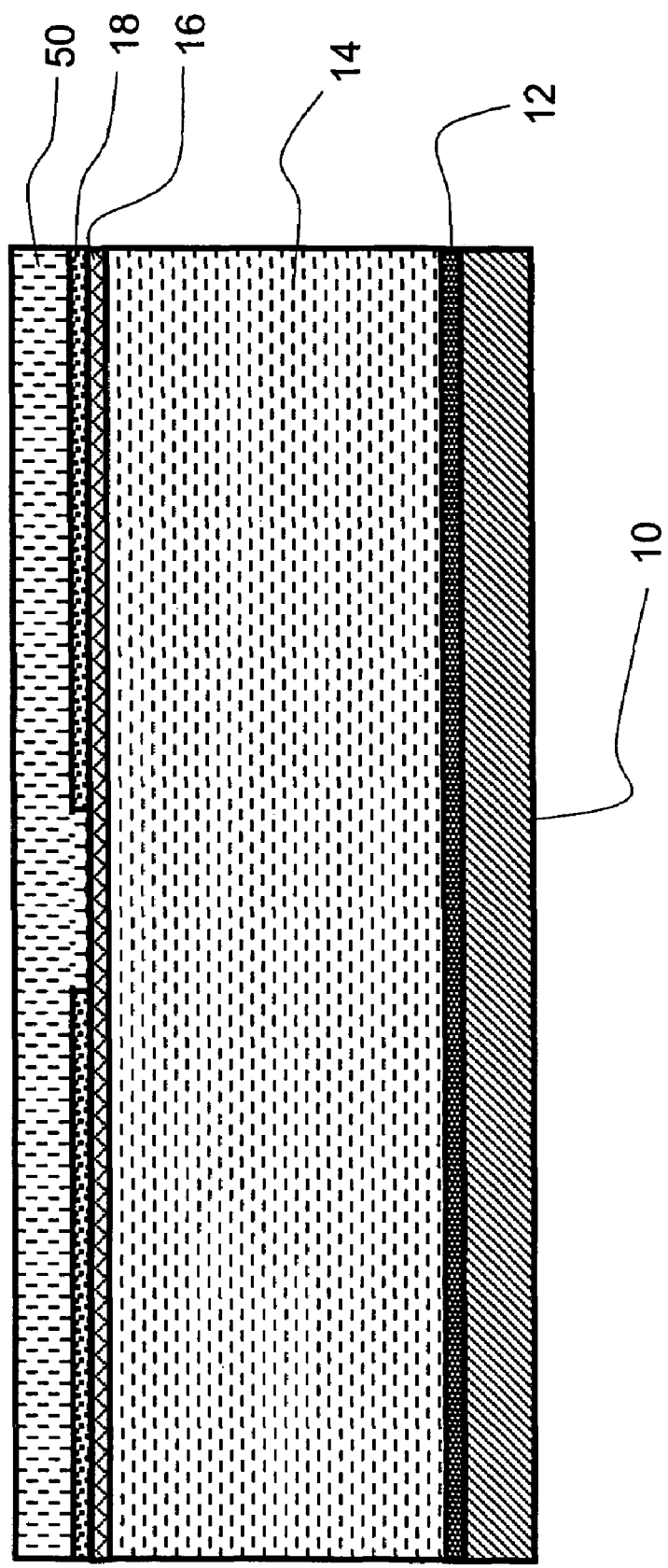
FIG. 8 is a schematic side view of the film structure of FIG. 7 after depositing a via resist layer, in accordance with a prior art process.
Figure 9:
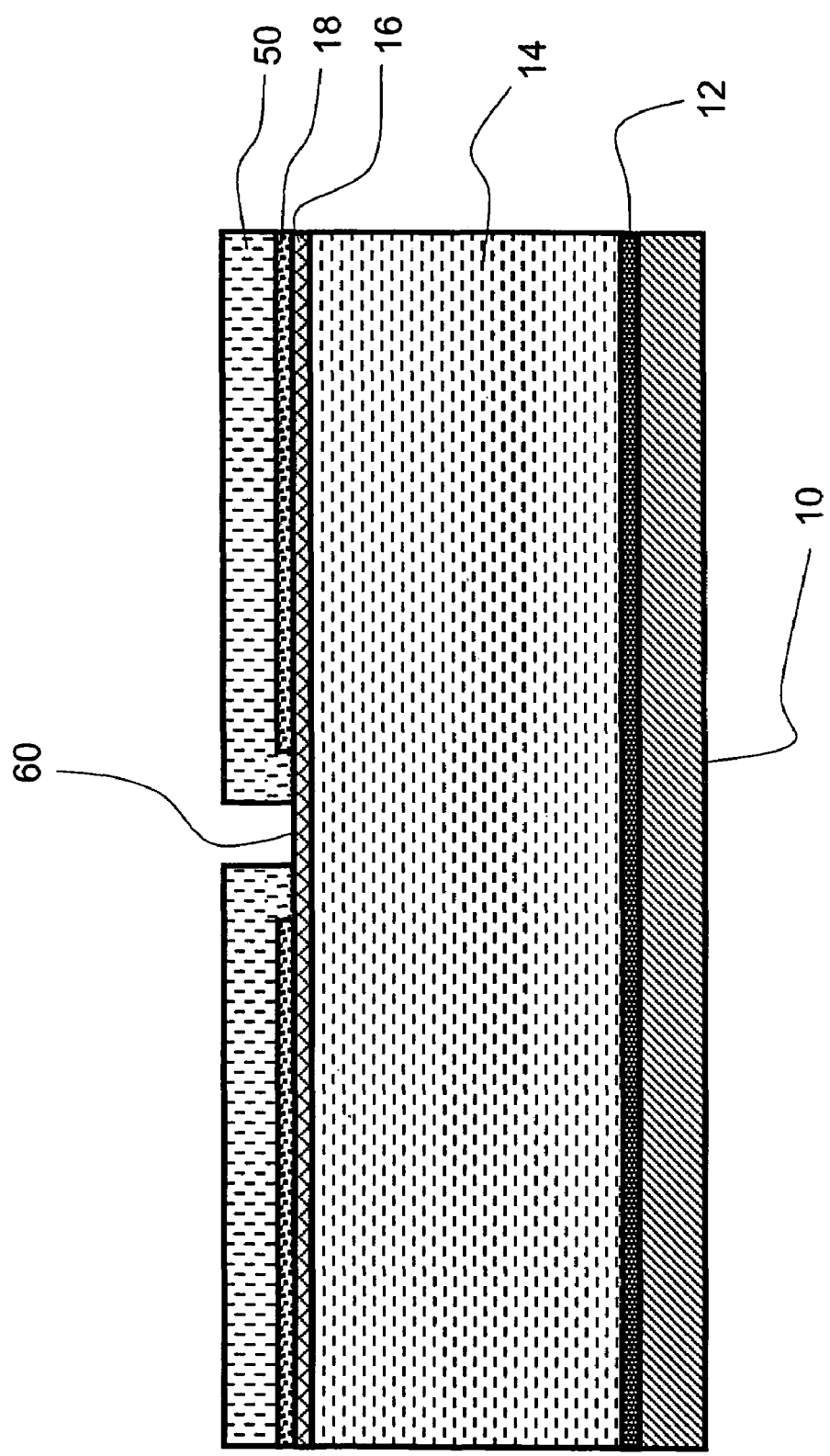
FIG. 9 is a schematic side view of the film structure of FIG. 8 after patterning the via resist layer, in accordance with a prior art process.
Figure 10:
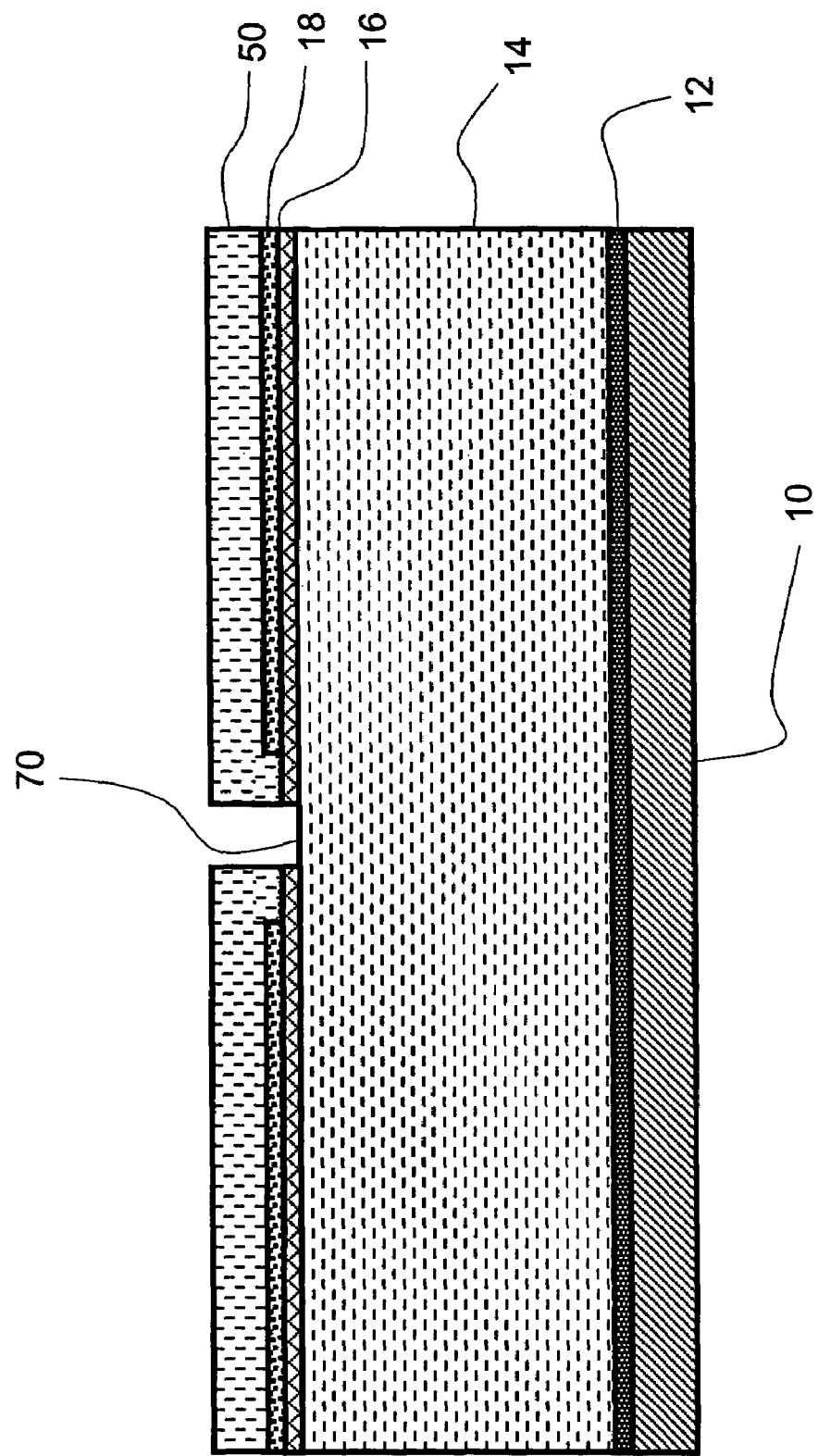
FIG. 10 is a schematic side view of the film structure of FIG. 9 after etching the first hard mask layer away from the via areas, in accordance with a prior art process.
Figure 11:
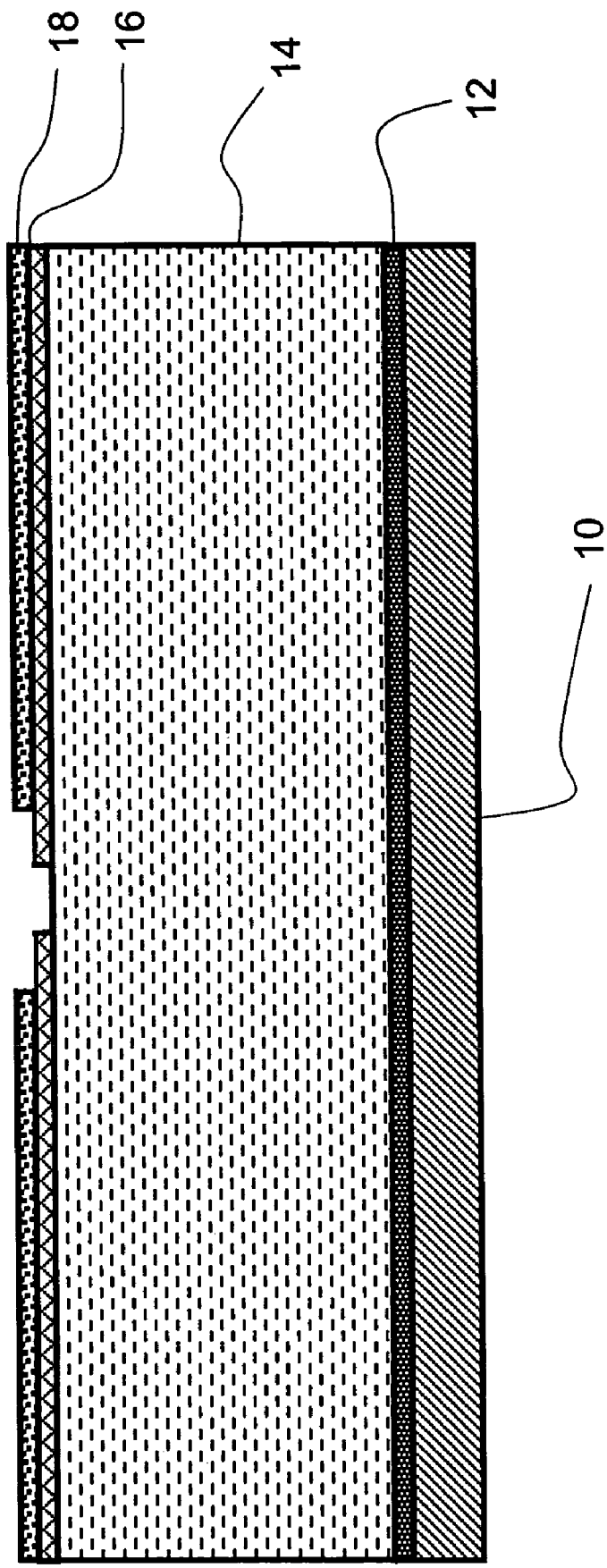
FIG. 11 is a schematic side view of the film structure of FIG. 10 after removing the residual via resist layer, in accordance with a prior art process.

With reference to FIG. 8, the first photoresist is then removed by ozone ashing and a second photoresist 50 is spread on the substrate surface, i.e., over the surfaces of the trench areas 40 and the top surface of the hard mask 18. Next, as shown in FIG. 9, the second photoresist 50 is patterned by exposure to ultraviolet light through a mask and dissolving the second photoresist away from the via areas 60. As shown in FIG. 10, the oxide hard mask 16 is then etched away from the via area 70. The second photoresist 50 protects the hard masks 16, 18 against etching. Subsequently, as shown in FIG. 11, the second photoresist is removed by ozone ashing and the surface is ready for via etching.

Figure 12:
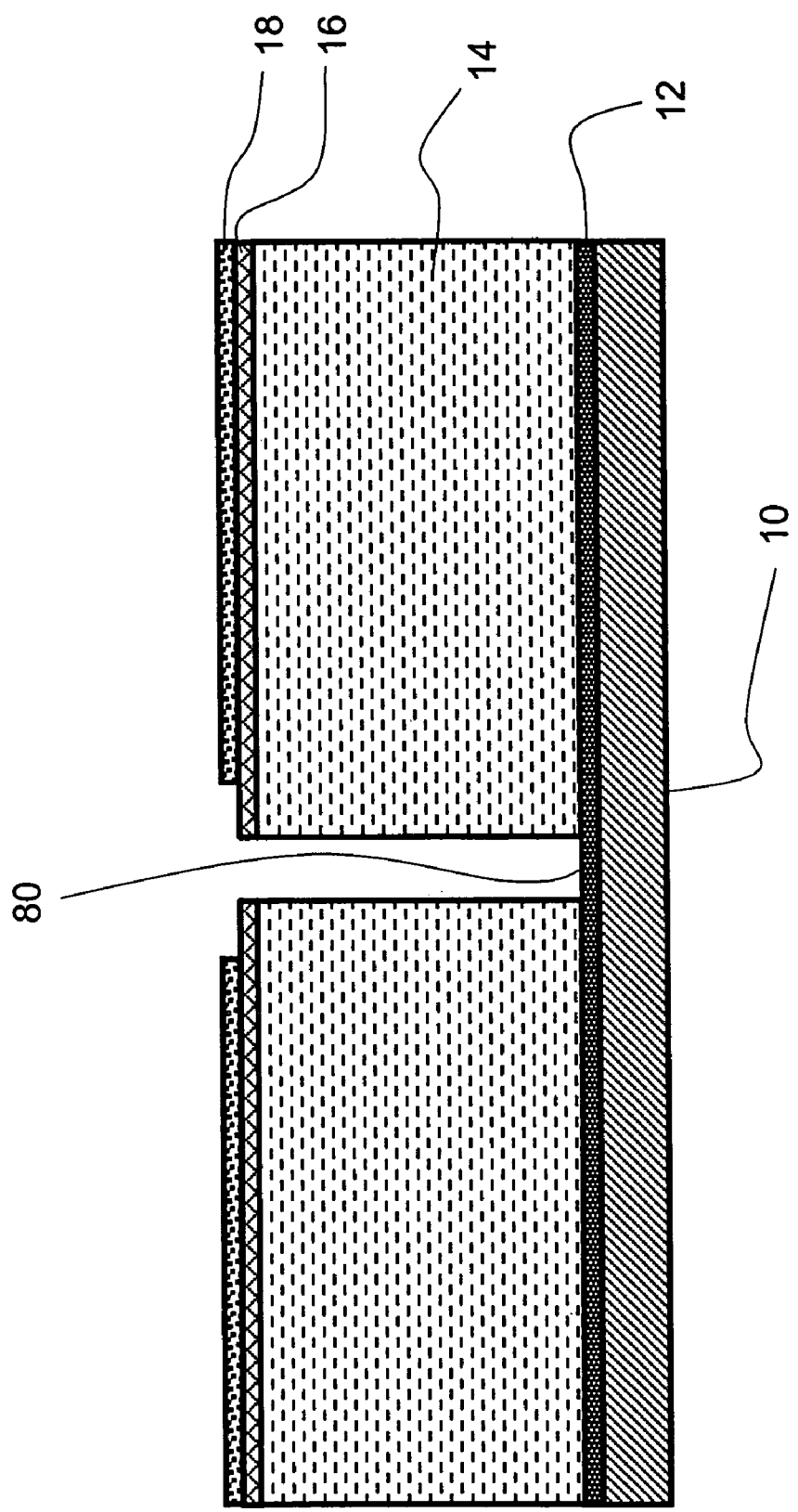
FIG. 12 is a schematic side view of the film structure of FIG. 11 after etching the vias into the dielectric layer, in accordance with a prior art process.
Figure 13:
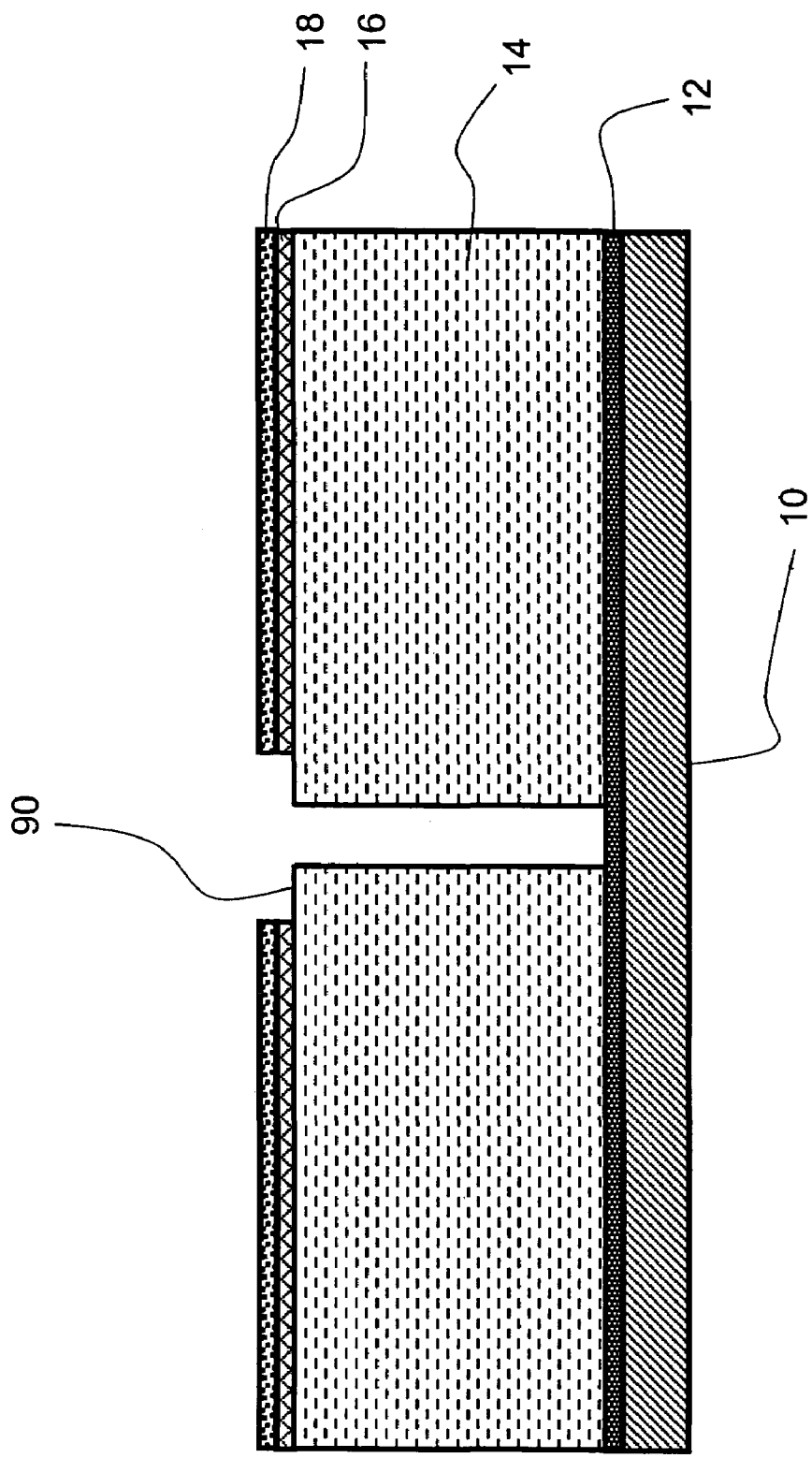
FIG. 13 is a schematic side view of the film structure of FIG. 12 after etching the first hard mask layer away from the trench areas, in accordance with a prior art process.
Figure 14:
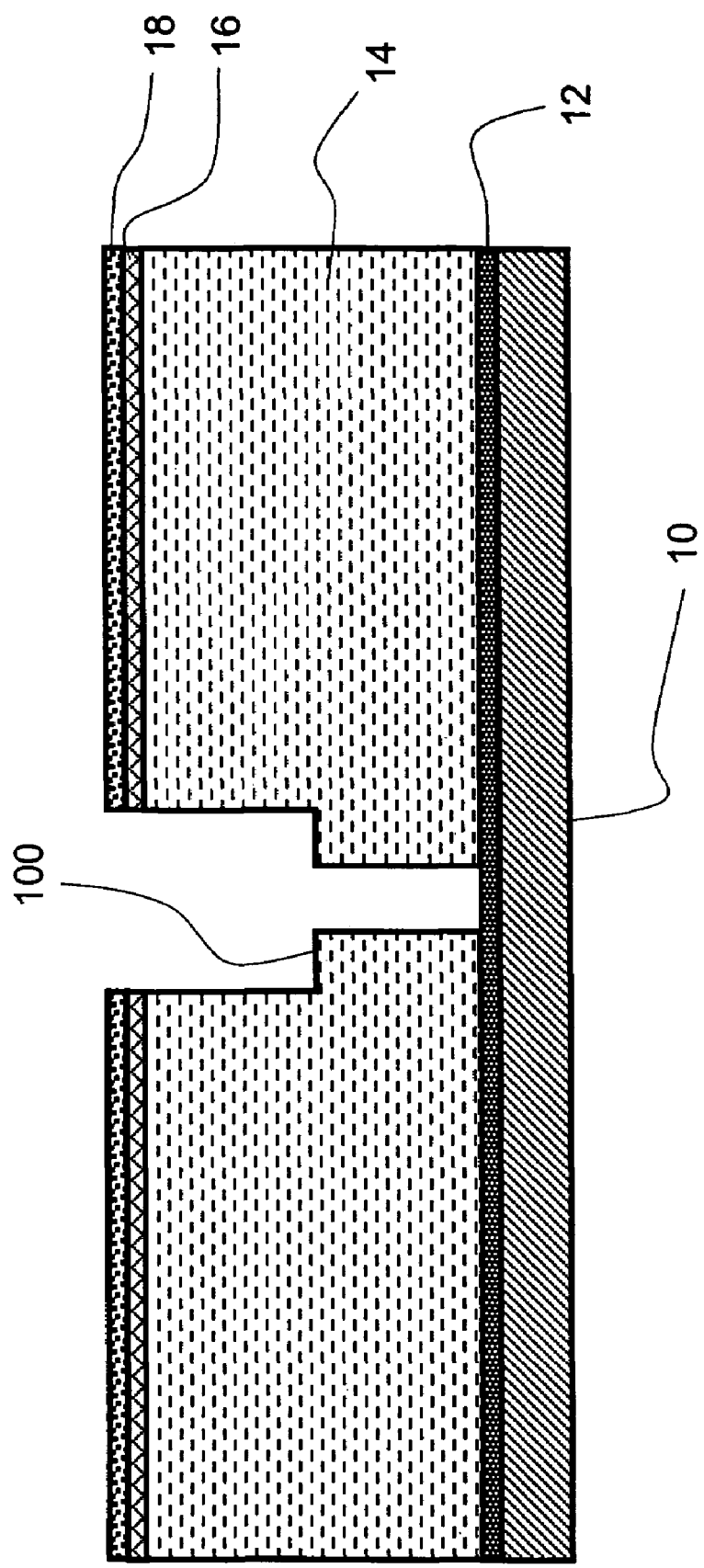
FIG. 14 is a schematic side view of the film structure of FIG. 13 after having a timed trench etch step, in accordance with a prior art process.
Figure 15:
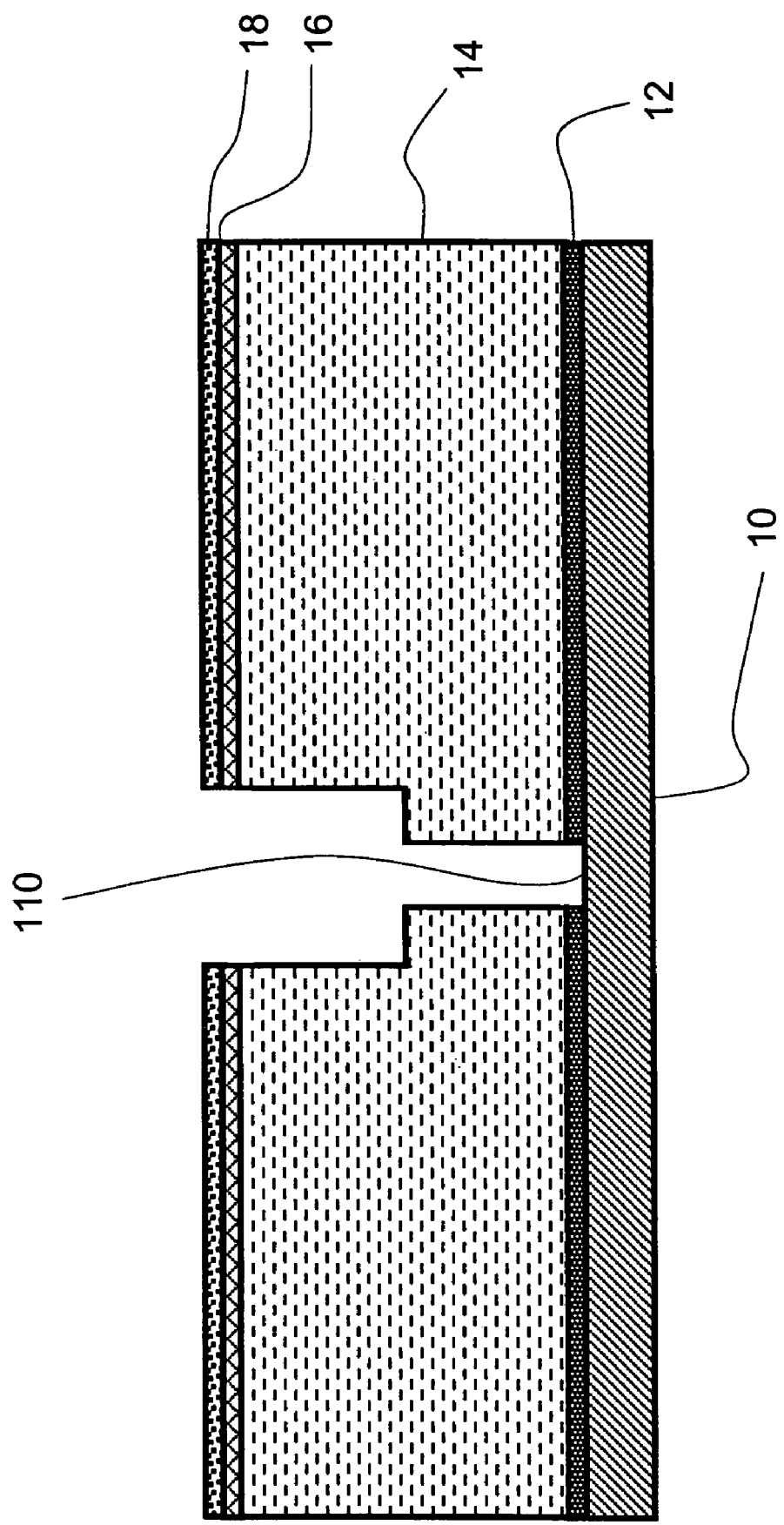
FIG. 15 is a schematic side view of the film structure of FIG. 14 after removing the dielectric copper diffusion barrier from the bottom of the vias, in accordance with a prior art process.

As shown in FIG. 12, a via opening 80 is next etched through the interlevel dielectric layer 14. As shown in FIG. 13, the oxide hard mask 16 is then etched away from the trench areas 90. Next, as shown in FIG. 14, a trench 100 is formed by timed etching in the dielectric layer 14. As shown in FIG. 15, the dielectric copper diffusion barrier 12 is then etched away from a bottom 110 of the via opening 80 so that the surface of the metallization layer 10 is exposed on the bottom.

Figure 16:
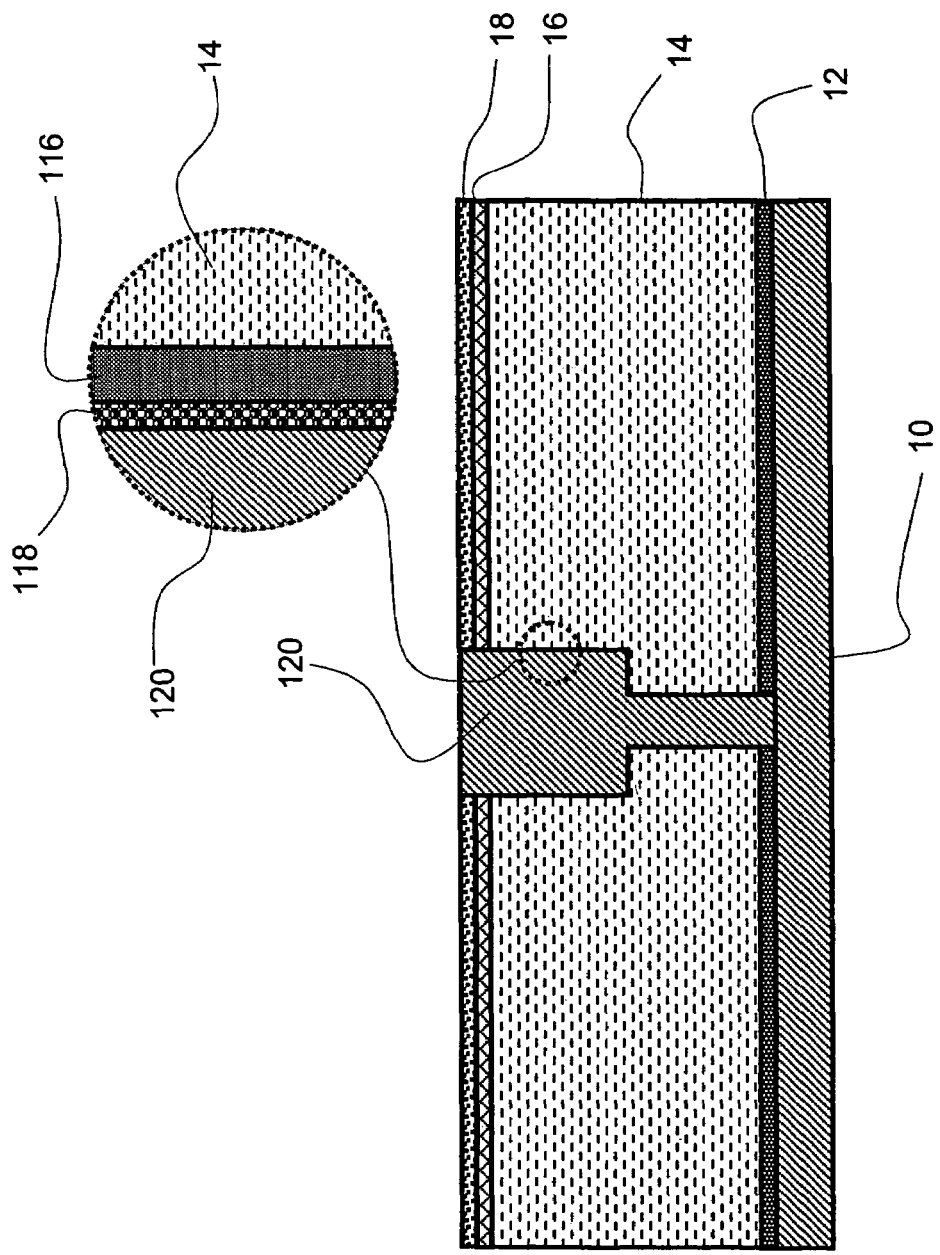
FIG. 16 is a schematic side view of the film structure of FIG. 15 after depositing a diffusion barrier, a seed layer, and bulk copper and a subsequent CMP step, in accordance with a prior art process.

Next, as shown in FIG. 16, a copper diffusion barrier 116 is deposited on the surfaces of the vias and trenches. A seed layer 118 is grown on the copper diffusion barrier 116. Vias and trenches are filled with bulk copper 120. The filling can be done for example by electrochemical deposition (electroplating, ECD), electroless plating, seedless plating, MOCVD copper superfill process or by reactive deposition from supercritical fluids (e.g., chemical fluid deposition (CFD) using supercritical carbon dioxide $CO_2$ as a solvent, discussed in greater detail below). The upper surface of the structure can be smoothed by chemical mechanical polishing (CMP).

Figure 17:
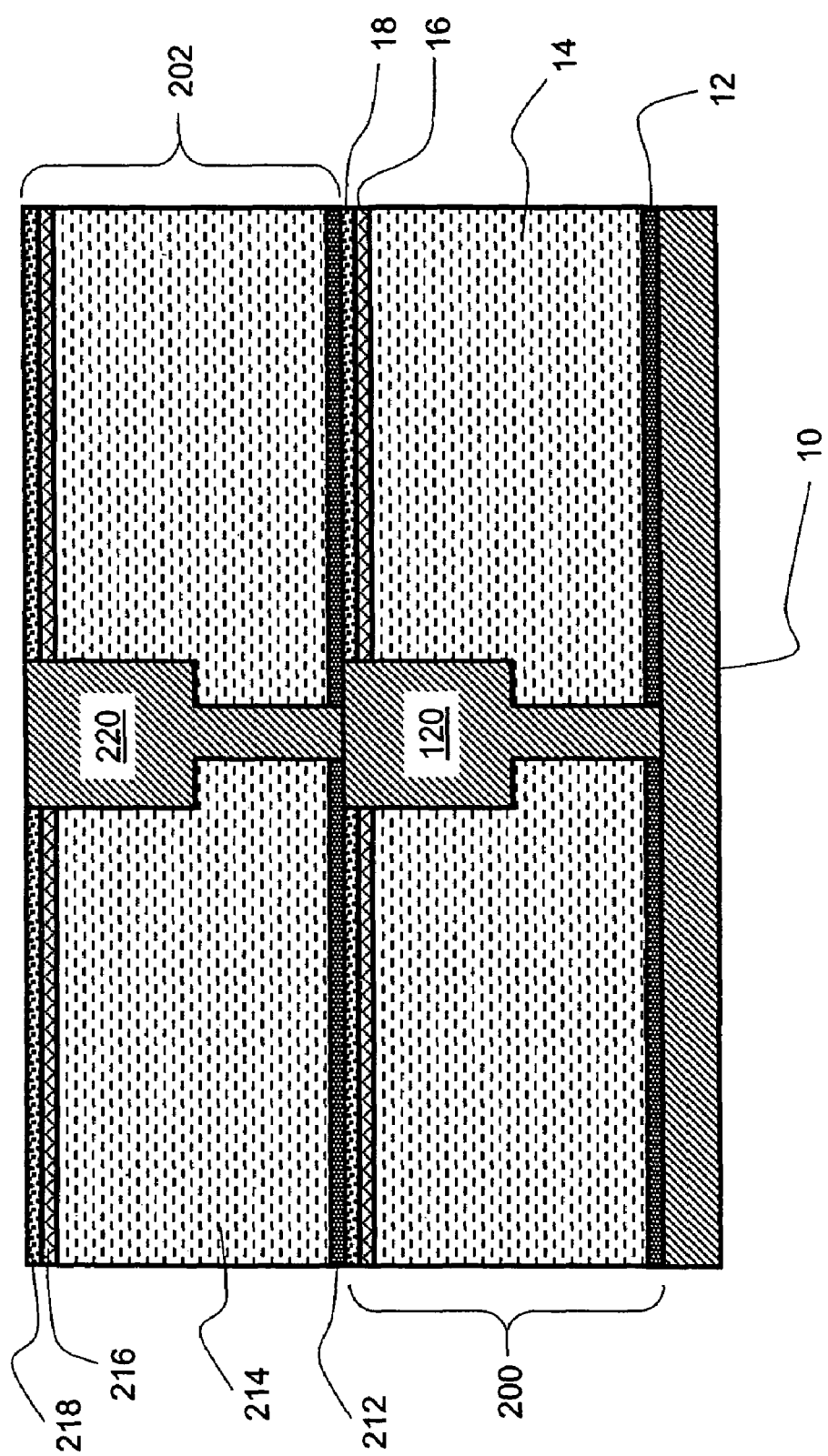
FIG. 17 is a schematic side view of the film structure of FIG. 16 having two metallization layers on top of each other, in accordance with a prior art process.

Additional metallization layers can be formed over the structure illustrated in FIG. 16. For example, FIG. 17 shows a structure that has two metallization layers, 120 and 220, on top of each other. Although only two metallization layers have been illustrated, it will be appreciated that modern microprocessors can require about 7–8 metallization layers or more for implementing complex wiring geometry. In addition, while the illustrated structure is shown with vertically aligned vias, it will be appreciated that this is for illustration purposes only and that vias between different levels are often not vertically aligned.

Figure 18:
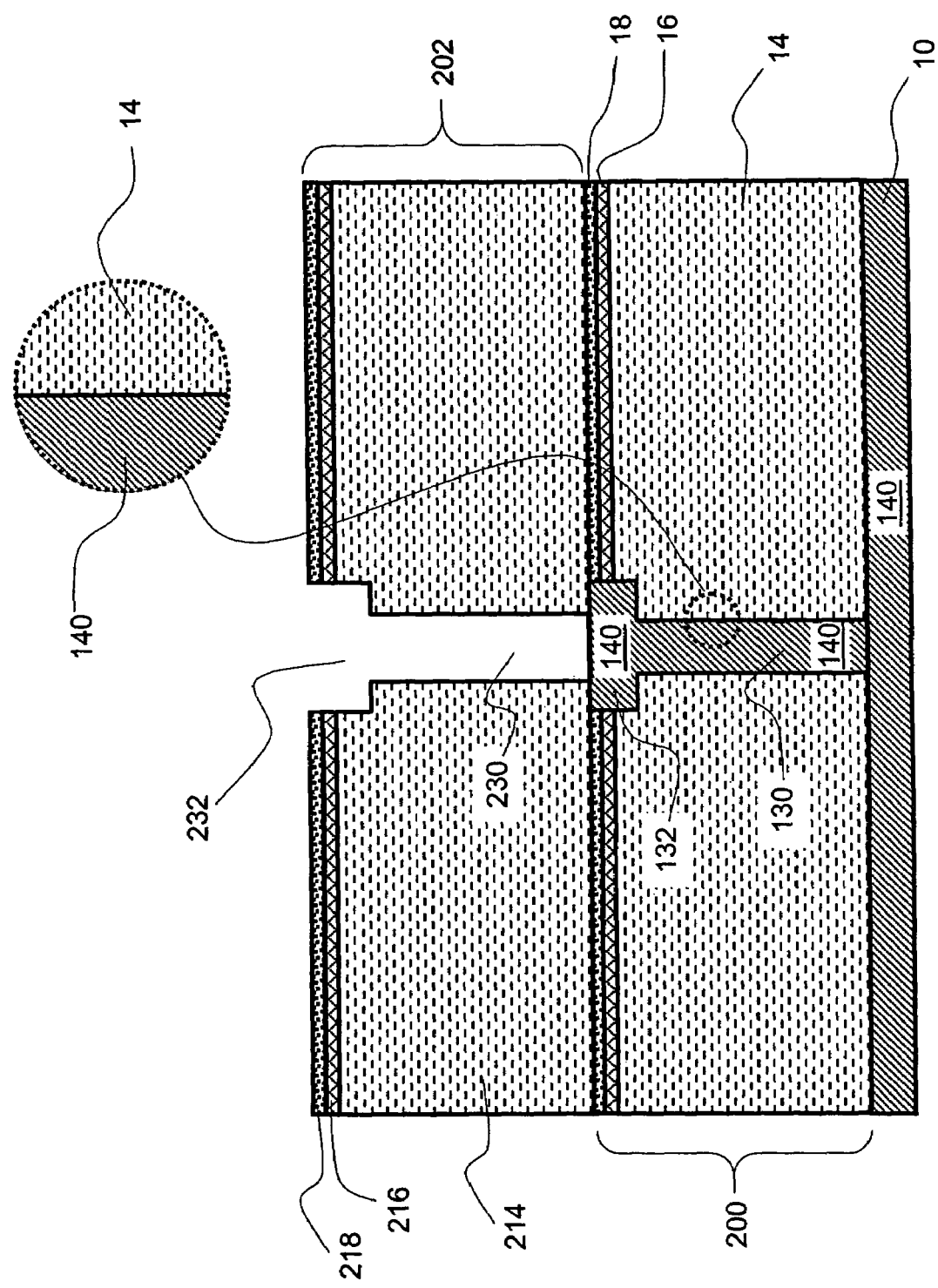
FIG. 18 is a schematic side view of a film structure formed in accordance with preferred embodiments of the present invention.

According to one preferred embodiment of the invention, a via 130 and a trench 132 are temporarily filled with sacrificial material 140, as shown in FIG. 18. The previous metallization level 10 has also been filled with sacrificial material 140, preferably without diffusion barriers. Advantageously, one process step can be eliminated per metallization level because it is not necessary to deposit a dielectric copper diffusion barrier on the metallization level 10. A dielectric layer 14 is preferably deposited on the metallization level 10. Oxide hard mask 16 and SiC hard mask 18 are then preferably deposited by CVD on the dielectric layer 14. Hard masks 16 and 18 are preferably patterned and the dielectric layer 14 preferably is etched to form vias 130 and trenches 132. Advantageously, one additional process step can be eliminated per metallization level 200 because, in the illustrated embodiment, it is not necessary to remove any dielectric diffusion barrier from the bottom of the vias 130. Then the vias 130 and trenches 132 are preferably filled with a sacrificial material 140. Less preferably, in some arrangements, the vias 130 and trenches 132 can be lined with a diffusion barrier before filling with sacrificial material 140.

The resulting structure can then be planarized by chemical mechanical polishing (CMP). Thus, two process steps can advantageously be eliminated per metallization level because a conductive copper diffusion barrier and a seed layer are not needed at this stage.

The process can be repeated on the next metallization level 202 by depositing a dielectric layer 214. Oxide hard mask 216 and SiC hard mask 218 preferably are grown by CVD and patterned to form via and trench areas. Vias 230 and trenches 232 are etched into the dielectric layer 214 and they are left unfilled at this stage because they are a part of the last metallization level 202 prior to metal filling in this example, although in the arrangements vias 230 and trenches 232 could be filled with sacrificial material, which can later be selectively removed.

As noted above, the cross-sectional area (orthogonal to the direction of current flow during operation of an integrated circuit containing conductors that will later fill the volume) of the volume containing the sacrificial material 140 preferably decreases with decreasing height. Thus, minimum dimension of a vertical cross-section of the volume for the metal line in the level 10 is preferably smaller than the minimum dimension of a horizontal cross-section of the via 130, which minimum dimension is preferably smaller than the minimum dimension of a vertical cross-section of the trench 140, which minimum dimension is preferably smaller than the minimum dimension of a horizontal cross-section of the via 230, which minimum dimension is preferably smaller than the minimum dimension of a vertical cross-section of the trench 232, and so on. It will be appreciated that the minimum dimension of the various horizontal cross-sections could be the width or length of that cross-section, e.g., the width or length of a via, and the minimum dimension of the various vertical cross-sections could be the width or height of a trench. It will also be appreciated that the horizontal cross-sections can typically be taken perpendicular to the longest dimension of the trench, as this dimension typically corresponds to the direction of current flow.

The sacrificial material 140 can be any material that can effectively be removed selectively after construction of multiple fabrication levels and, most preferably, after construction of the last metallization layer. For example, the sacrificial material 140 can be a metal that can be etched away without etching away the surrounding oxide ILD in the illustrated embodiment. In other arrangements, the ability to selectively etch relative to previously formed diffusion barriers can dictate the choice of sacrificial material. Preferably, the metal is aluminum or nickel. Chlorine gas can etch aluminum metal and carbon monoxide (CO) gas can etch nickel metal. In the illustrated embodiment, the sacrificial metal is deposited so that it substantially fills the vias and trenches. In another embodiment, the sacrificial metal, or any other sacrificial material that can be removed below about 400° C. from the substrate during a later process step, is deposited so that it grows mainly at the collar area of the trenches and the rest of the trenches and vias stay empty, i.e., the sacrificial material plugs or blocks the trench or via opening, but does not fill it. This kind of partial deposition advantageously can shorten the removal time of the sacrificial metal at a later stage of processing.

The sacrificial material 140 can also be organic material that can be stripped away selectively. For example, the organic material can be photoresist, which can be stripped away when the photoresist reacts to form volatile compounds. Suitable stripping processes include wet and dry ashing processes. Dry ashing is done either with ozone or oxygen plasma. Wet ashing is usually done with a solution of sulfuric acid and hydrogen peroxide.

In another non-limiting example, the sacrificial material 140 can also be a compound that can be selectively removed by subliming below about 400° C. Antimony trioxide ($Sb_2O_3$) and tellurium (Te) serve as examples of materials that have suitable volatility at about 300–400° C. Thus, it will be appreciated that various other sacrificial materials and/or removal processes can be utilized, so long as the material can effectively be removed from the film structures described herein to allow bulk conductor deposition.

Figure 19:
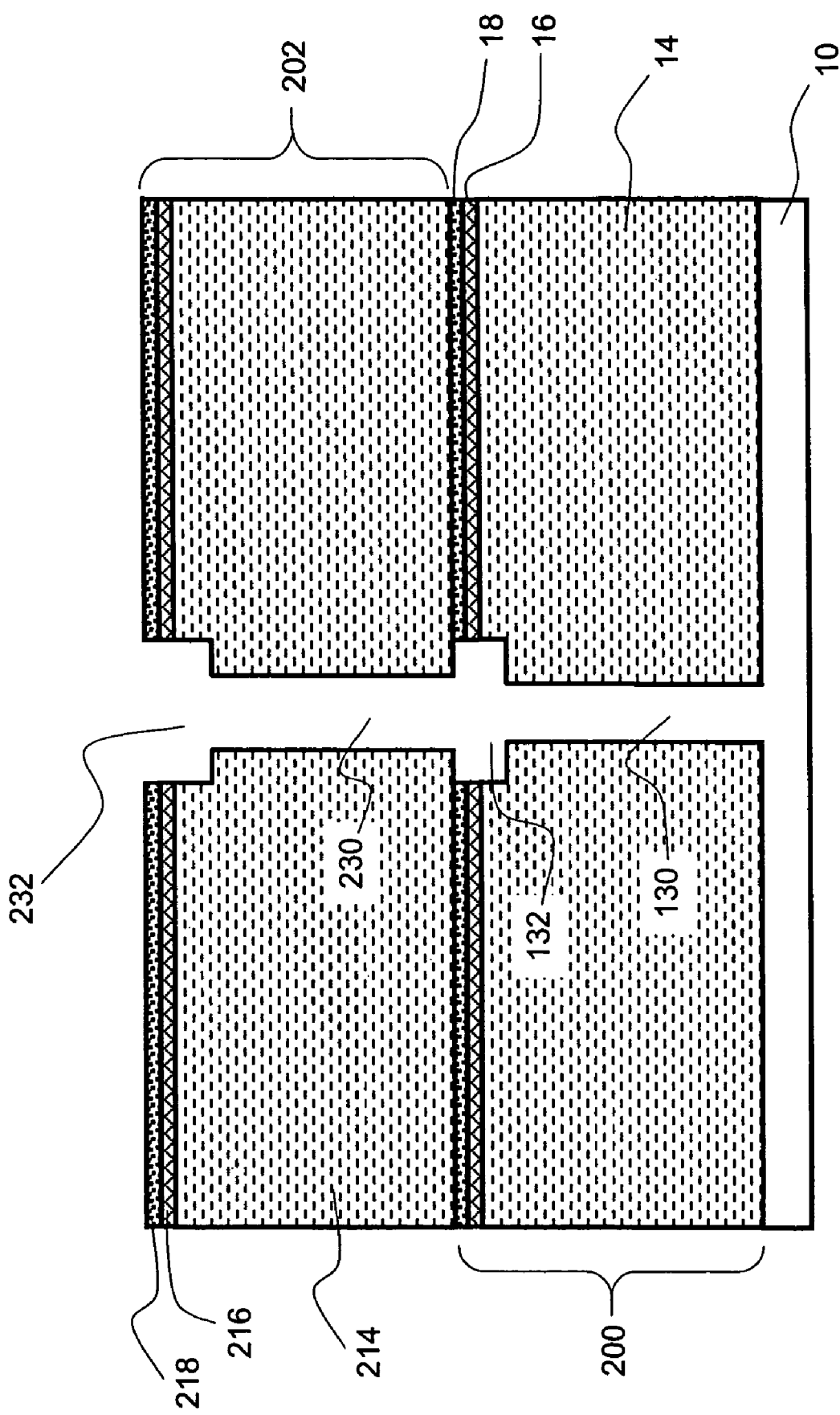
FIG. 19 is a schematic side view of a structure having emptied vias and trenches, formed in accordance with preferred embodiments of the present invention.

FIG. 19 shows a structure where the sacrificial material has been removed, for example, by etching, ashing or sublimation. Trenches 10, 132, 232 and vias 130, 230 are thus shown forming a contiguous opening after the removal process.

Figure 20:
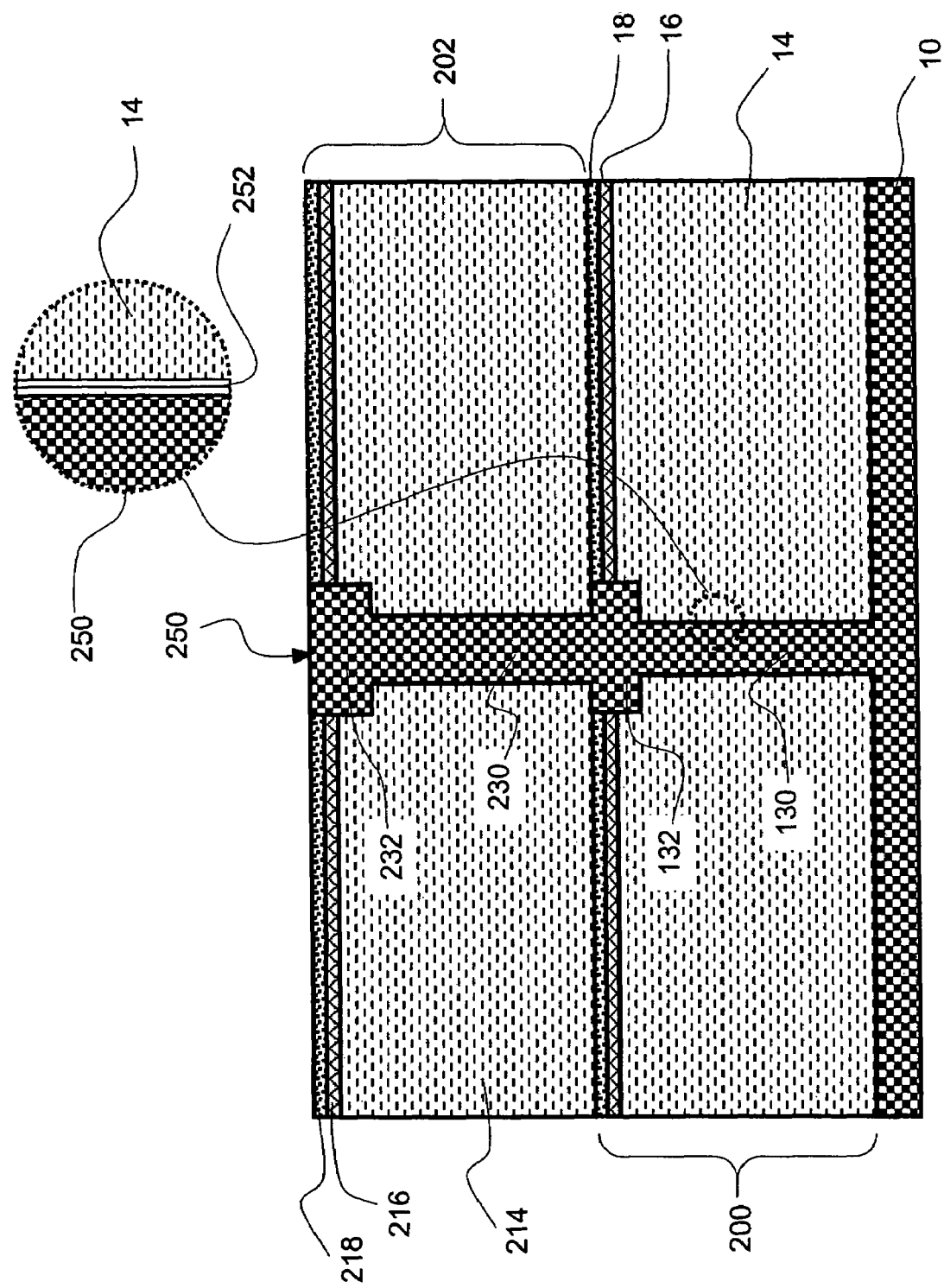
FIG. 20 is a schematic side view of a structure having refilled vias and trenches, formed in accordance with preferred embodiments of the present invention.

FIG. 20 shows a structure where all the trenches 10, 132, 232 and vias 130, 230 have been metallized, forming the conductor 250. Optionally, the metallization can consist of a deposition of a diffusion barrier 252 on the surfaces of the vias 130 and 230 and trenches 10, 132, and 232. The diffusion barrier 252 is preferably deposited when the conductor 250 is a conductor prone to diffusion, e.g., copper, silver or gold, or an oxygen-sensitive polymer. Exemplary diffusion barrier materials include tungsten nitride carbide ($WN_xC_y$) and titanium nitride (TiN). The diffusion barrier 252 is deposited just prior to simultaneously filling multiple levels of the metallization template, preferably by ALD to give a highly conformal layer.

Then the vias and trenches are preferably filled with the electrical conductor 250. The conductor 250 is preferably a conductive elemental metal, such as tungsten, and more preferably is copper, silver or gold. As with deposition of the optional diffusion barrier 252, ALD is preferred for deposition of the conductor because it enables relatively uniform film growth rate and relatively full step coverage on very complex structures. For example, titanium nitride (TiN) films grown by ALD have nearly 100% step coverage in ultra high aspect ratio (about 80:1 or more) vias. Advantageously, the smallest features in the first metallization level can be filled first and the larger features in the last metallization level can be filled last. Thus, the progressively larger open volumes discussed above can be filled from the bottom of the template on up.

As is known in the art, atomic layer deposition employs alternating surface reactions whereby the apparatus, and particularly the substrate on which deposition is to be conducted, is maintained at a temperature above the condensation temperature for the vapor phase reactants and below the thermal decomposition temperatures of the reactants. Sequential reactant pulses are separated in time and space to avoid gas phase reaction, since the reactants used for ALD are typically highly mutually reactive. For example, after a first reactant pulse, excess reactant and any by-product can be removed from the chamber prior to the next reactant, such as by purging with an inert gas. In a first pulse, reactant adsorbs, largely intact, on the substrate of interest in a self-limiting, self-saturating process, leaving no more than about one monolayer of reactant. In a typical arrangement, the reactant includes termination ligands that are not reactive with the gas phase of the same reactant pulse. After removal of excess reactant, the next reactant will react with the terminations, either stripping the ligands or replacing the ligands with another element or molecule of interest for the deposited layer. The second reactant is removed and either a third reactant can be introduced and removed, etc. or the cycle can start again with the first reactant. Accordingly, no more than a molecular monolayer of the desired material is formed per cycle. In fact, typically less than a monolayer will form, due to steric hindrance by bulky source chemicals blocking possible reactive sites on the surface or due to the limited number of available reactive surface sites. Exemplary ALD reactants for the deposition of electrically conductive diffusion barriers, such as TiN and $WN_xC_y$, within vias and trenches include metal halides such as $TiCl_4$ and $WF_6$, nitrogen compounds such as $NH_3$ and reducing/gettering agents such as triethylboron. Exemplary ALD reactants for the deposition of metal conductors such as tungsten metal include metal compounds such as $WF_6$ and reducing agents such as boranes (e.g., diborane $B_2H_6$). Variations on ALD, however, can arrive at more than a monolayer per cycle, while still deriving some of the benefit of self-limiting behavior.

In addition to ALD, the conductor can also be deposited by chemical fluid deposition (CFD) utilizing supercritical fluids. A supercritical fluid (SCF) is a substance above its critical temperature and critical pressure. For example, $CO_2$ becomes a supercritical fluid when the temperature is above about +31° C. and the pressure is above about 73.75 bar. Mass transfer is rapid with supercritical fluids. Dynamic viscosities are about one order of magnitude smaller than in normal liquids and the surface tension of the supercritical fluid is negligible. Diffusion coefficients in supercritical fluids can be about one order of magnitude higher than in normal liquid. Advantageously, transport properties resemble those of gases while the density is near the density of liquids. SCFs penetrate into extremely narrow openings and dissolve a wide variety of compounds. Metals including copper can be dissolved into supercritical $CO_2$ (typical conditions are about +60° C., about 150 bar) with the aid of a chelating compound added to the solution. Organometallic copper compounds can also be dissolved in supercritical $CO_2$. PCT publication WO 03/053895, A. Cabanas et al. in *J. Chemistry of Materials,* vol. 15(15) (2003), pp. 2910–2916, E. Kondoh et al. in *Microelectronic Engineering,* vol. 64(1–4) (2002) pp. 495–499 and J. M. Blackburn et al. in *Science,* vol. 294(5540) (2001) pp. 141–145, serve as examples of copper deposition from supercritical $CO_2$. Each of these references is incorporated by reference herein.

It will be appreciated that the deposited conductive material 250 can be a conductor other than a metal. In some embodiments, the conductive material 250 can be a conductive polymer. Exemplary conductive polymers include, but are not limited to, iodine-doped polyacetylene, polyaniline, polypyrrole or polythiophenes. The polymer can be injection molded into trenches and vias in the case of thermosetting polymers. In other embodiments, monomers are polymerized and doped in situ to form electrically conducting polymers that fill the trenches and vias. For example, in one embodiment, the surfaces of vias and trenches are coated with a molecular layer of Ziegler-Natta catalyst, such as $Ti(OC_4H_9)_4/Al(C_2H_5)_3$, or any other compound that promotes the polymerization process. Exposure of the substrate to iodine or an iodine compound that releases iodine is performed either before the introduction of acetylene gas or at intervals during the introduction of acetylene gas into the reaction chamber. Then the openings are exposed to acetylene gas (as a monomer) and the openings become filled with polyacetylene that is doped with iodine. Liquid phase synthesis of polyacetylene has been described, e.g., by H. Shirakawa et al. in *J.C.S. Chem. Comm.* (1977), pp. 578–580, and B. Lesiak et al. in *Polish J. Chem.,* 74 (2000) pp. 847–865. Each of these references is incorporated by reference herein. The catalysts discussed in those publications are applied to the synthesis of doped conductive polymer from the gaseous monomers on the surfaces of vias and trenches.

In yet other embodiments, the conductor 250 can be carbon nanotube wire. In particular, relatively short carbon nanotube bits are suspended in a fluid, such as supercritical $CO_2$, and introduced to the vias 130 and 230 and trenches 10, 132, 232. Then the fluid is carefully vaporized by lowering the pressure of the reaction chamber and the carbon nanotube bits adhere to each other through van der Waals interactions. Electrical current is then allowed to flow through the carbon nanotubes. Electrical conductivity of the carbon nanotube conductor improves during the current treatment possibly because of the formation of continuous carbon nanotube wires that can withstand extremely high current densities. "Welding" of carbon nanotubes to each other with electrical current has been suggested by K. Jiang et al. in *Nature,* 419 (2002) p. 801, which is incorporated by reference herein.

In other embodiments, the conductor 250 can be made of nanometal powder. A suitable nanometal powder is sold by Argonide Corporation, 291 Power Court, Sanford, Fla., USA. Preferably, in one embodiment, nanometal powder is suspended as a slurry in an inert fluid such as supercritical $CO_2$ and then introduced to the vias and trenches. Fluid is carefully removed from the structure by slowly decreasing the pressure of the reaction chamber. Then the substrate is heated to about 200–300° C. to start the sintering process. Nanometal particles fuse together and form a continuous conductor that extends through the whole trench/via structure. It is beneficial to select a nanometal powder mixture where the size distribution of the particles is fractal-like, for example, with three distinct size levels. The use of such a mixture enables very dense packing of metal particles into the vias and trenches, because the smallest particles (e.g., about 1–3 nm in diameter) can fill the holes between the medium size particles (e.g., about 5–8 nm in diameter) and the medium size particles can fill the holes between the large size particles (e.g., about 10–20 nm in diameter). In this case the sintering process does not substantially decrease the volume of the conductor because there is little empty space between the particles before the sintering process.

In yet other preferred embodiments, the conductor 250 can also be made of ultraconductors that contain polaron threads. L. Grigorov et al. teach in U.S. Pat. No. 5,777,292, the disclosure of which is incorporated herein by reference, the creation of a conductor that has polarons forming conducting threads through the material. More about polaron conductors has also been presented in a web page, http://www.ultraconductors.com. An electron with an accompanying local distortion in the material is called a polaron. Often the polaron is trapped by an impurity in the material. The polaron creates a potential well around itself. The electron in the polaron can move and serve as a carrier of electricity when the polarons are chained. Advantageously, the resistivity of the ultraconductors is between the resistivity of copper and superconductors, even above room temperature. In addition, extremely small RC delay is obtained and contact resistance is negligible.

As noted above, it will be appreciated that the methods discussed above can advantageously be applied to deposit a conductor or barrier layer simultaneously in more than one fabrication level in any context in which multiple steps at different times have traditionally been used to form different contiguous parts of a conductive path. For example, in addition to standard single and dual damascene structures, the present invention can be utilized when at least two silicon-on-insulator (SOI) wafers are bonded together and long via plugs are formed through the wafer-bonded structure. The wafer bonding method has been presented by J.-Q. Lü et al. in the proceedings of Advanced Metallization Conference 2000 (ULSI XVI), pp. 515–521, the disclosure of which is incorporated herein by reference. The via plugs and other metallization structures can be formed as discussed above.

It will also be appreciated that the present invention offers various advantages. One benefit of the present invention is that a continuous conductor can be formed without any interfaces between metallization levels; for example, the conductor can be made to extend from the first metallization level towards the bottom of the structure to the last metallization level on top of the structure, making the RC delay of interconnects small. In contrast, conventional dual damascene barriers (typically metal nitrides) intervene between metals, e.g., copper, of different levels at contact or via landing pads. Also, conductors formed in accordance with the present invention also preferably have successively larger cross-sections with increasing height, as discussed above. In addition, in embodiments where a barrier layer is formed, the barrier layer is also formed simultaneously over various fabrication levels. In terms of process efficiency, another benefit of the invention is that about 2–3 process steps per metallization level can be eliminated. In addition to saving time and resources, relative to multiple barrier depositions, such a process also contrasts to typical integrated circuit structures in that the barrier layers advantageously only surround the conductive lines and vias rather than underlying an entire ILD layer. Accordingly, all of the barrier materials can be made conductive without risking short circuits. Moreover, the resultant barrier layers is continuous and has a uniform composition and thickness throughout the volume occupied by the continuous conductor.

While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiments disclosed, but that the invention will be defined by the appended claims.

We claim:

1. A process for forming a conductive element, comprising:
   providing a semiconductor substrate;
   depositing a sacrificial material over the substrate, wherein the sacrificial material comprises a metal or an organic material;
   forming an insulating layer over the sacrificial material;
   forming an opening through the insulating layer to partially expose the sacrificial material;
   selectively removing the sacrificial material to form a buried open volume; and
   simultaneously depositing a conductor in the buried open volume and the opening to form the conductive element.

2. The process of claim 1, wherein simultaneously depositing the conductor comprises performing atomic layer deposition.

3. The process of claim 1, wherein simultaneously depositing the conductor comprises simultaneously completely filling the open volume and the opening with a conductor.

4. The process of claim 1, further comprising depositing the sacrificial material into the opening, forming an additional insulating layer over the opening and forming an additional opening in the additional insulating layer before selectively removing the sacrificial material.

5. The process of claim 4, further comprising depositing a barrier layer by atomic layer deposition after forming an additional opening and before simultaneously depositing the conductor.

6. The method of claim 4, wherein the opening is a via and the additional opening is a trench.

7. The method of claim 1, wherein the sacrificial material completely fills the open volume before being selectively removed.

8. The process of claim 1, wherein the sacrificial material comprises a metal, wherein the metal comprises aluminum.

9. The process of claim 8, wherein selectively removing the sacrificial material comprises etching the metal with chlorine gas.

10. The process of claim 1, wherein the sacrificial material comprises a metal, wherein the metal comprises nickel.

11. The process of claim 10, wherein selectively removing the sacrificial material comprises etching the metal with carbon monoxide gas.

12. The process of claim 1, wherein the sacrificial material comprises an organic material, wherein the organic material comprises a photoresist.

13. The process of claim 12, wherein selectively removing the sacrificial material comprises stripping away the sacrificial material by wet ashing.

14. The process of claim 13, wherein stripping away the sacrificial material by wet ashing comprises reacting the sacrificial material with a sulfuric acid and hydrogen peroxide solution.

15. The process of claim 12, wherein selectively removing the sacrificial material comprises stripping away the sacrificial material by dry ashing.

16. The process of claim 15, wherein stripping away the sacrificial material by dry ashing comprises reacting the sacrificial material with an ozone or an oxygen plasma.

17. A process for forming a conductive element comprising:

providing a semiconductor substrate;
depositing a sacrificial material over the substrate, wherein the sacrificial material comprises a material that can be sublimed below about 400° C.;
forming an insulating layer over the sacrificial material;
forming an opening through the insulating layer to partially expose the sacrificial material;
selectively removing the sacrificial material to form a buried open volume; and
simultaneously depositing a conductor in the buried open volume and the opening to form the conductive element.

18. The process of claim 17, wherein the material comprises antimony trioxide ($Sb_2O_3$) or tellurium (Te).

19. A method of semiconductor processing, comprising:
providing a partially fabricated integrated circuit having a top surface and a generally vertical opening leading to a buried open volume, wherein the buried open volume extends laterally beneath the top surface; and
forming a conductive line under the top surface by substantially filling the buried open volume with a conductor, wherein forming a conductive line comprises depositing a metal selected from the group consisting of copper, silver and gold.

20. The method of claim 19, wherein the buried open volume comprises a plurality of contiguous trenches and vias.

21. The method of claim 19, wherein substantially filling the open volume comprises performing chemical fluid deposition, with the conductor dissolved in a supercritical fluid.

22. The method of claim 21, wherein the supercritical fluid used in chemical fluid deposition is supercritical carbon dioxide and wherein the conductor is dissolved in the supercritical fluid at a temperature of about 60° C. and a pressure of about 150 bar.

23. A method of semiconductor processing, comprising:
providing a partially fabricated integrated circuit having a top surface and a generally vertical opening leading to a buried open volume, wherein the buried open volume extends laterally beneath the top surface; and
forming a conductive line under the top surface by substantially filling the buried open volume with a conductor, wherein substantially filling the open volume comprises depositing the conductor by atomic layer deposition.

24. A method of semiconductor processing, comprising:
providing a partially fabricated integrated circuit having a top surface and a generally vertical opening leading to a buried open volume, wherein the buried open volume extends laterally beneath the top surface; and
forming a conductive line under the top surface by substantially filling the buried open volume with a conductor, wherein forming a conductive line comprises filling the open volume with a conductive polymer.

25. The method of claim 24, wherein the conductive polymer is chosen from the group consisting of polyaniline, polypyrrole, polythiophenes and iodine doped polyacetylene.

26. A method of semiconductor processing, comprising:
providing a partially fabricated integrated circuit having a top surface and a generally vertical opening leading to a buried open volume, wherein the buried open volume extends laterally beneath the top surface; and
forming a conductive line under the top surface by substantially filling the buried open volume with a conductor, wherein forming a conductive line comprises forming a wire comprising carbon nanotube bits, wherein forming the wire comprises:
suspending the carbon nanotube bits in a supercritical fluid to form a carbon nanotube mixture;
introducing the mixture into the open volume;
removing the supercritical fluid by vaporization; and
applying a weak electric field to join the carbon nanotube bits together.

27. A method of semiconductor processing, comprising:
providing a partially fabricated integrated circuit having a top surface and a generally vertical opening leading to a buried open volume, wherein the buried open volume extends laterally beneath the top surface; and
forming a conductive line under the top surface by substantially filling the buried open volume with a conductor, wherein forming a conductive line comprises:
forming a nanometal slurry by suspending a nanometal powder in a supercritical fluid;
introducing the slurry into the open volume;
removing the supercritical fluid by decreasing a pressure of an ambient atmosphere of the partially fabricated integrated circuit;
subsequently sintering the nanometal powder by heating the partially fabricated integrated circuit to a temperature between about 200° C. and about 300° C.

28. The method of claim 27, wherein the nanometal powder consists of particles having a diameter of about 1–3 nm, particles having a diameter of about 5–8 nm and particles having a diameter of about 10–20 nm.

29. A method of semiconductor processing, comprising:
providing a partially fabricated integrated circuit having a top surface and a generally vertical opening leading to a buried open volume, wherein the buried open volume extends laterally beneath the top surface; and
forming a conductive line under the top surface by substantially filling the buried open volume with a conductor, wherein the conductor comprises polaron threads.

30. The method of claim 19, wherein the partially fabricated integrated circuit comprises at least two wafers bonded together.

31. A method of semiconductor processing, comprising:
providing a semiconductor wafer having a sacrificial material, wherein the sacrificial material extends horizontally underneath a top surface of the wafer;
removing the sacrificial material to form an opening, wherein the opening spans more than one fabrication level; and
depositing at least one monolayer of a material within the opening, wherein a cross-sectional area of the opening increases with decreasing distance to the top surface.

32. The method of claim 31, further comprising depositing a diffusion layer after removing the sacrificial material and before depositing at least one monolayer.

33. The method of claim 32, wherein the diffusion layer is deposited by atomic layer deposition.

34. The method of claim 32, wherein the diffusion layer comprises tungsten nitride carbide.

35. The method of claim 32, wherein the at least one monolayer comprises copper, silver, gold or a polymer.

36. The method of claim 31, wherein the material is conductive.

37. The method of claim 36, wherein depositing at least one monolayer of a material comprises depositing monolayers until the opening is filled with the material.

38. The method of claim 36, wherein depositing at least one monolayer of a material forms a conductive line for connecting electrical devices.

* * * * *

UNITED STATES PATENT AND TRADEMARK OFFICE
CERTIFICATE OF CORRECTION

PATENT NO. : 7,018,917 B2 Page 1 of 1
APPLICATION NO. : 10/719277
DATED : March 28, 2006
INVENTOR(S) : Kai-Erik Elers It is certified that error appears in the above-identified patent and that said Letters Patent is hereby corrected as shown below:

Column 12, Line 66, in Claim 17, after "element" insert --,--.

Signed and Sealed this

Twelfth Day of September, 2006

JON W. DUDAS
*Director of the United States Patent and Trademark Office*